(12) United States Patent
Michijima et al.

(10) Patent No.: US 6,396,735 B2
(45) Date of Patent: May 28, 2002

(54) MAGNETIC MEMORY ELEMENT, MAGNETIC MEMORY AND MANUFACTURING METHOD OF MAGNETIC MEMORY

(75) Inventors: Masashi Michijima, Soraku-gun; Hidekazu Hayashi, Tenri; Ryoji Minakata, Nara, all of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/814,560

(22) Filed: Mar. 22, 2001

(30) Foreign Application Priority Data

| Mar. 23, 2000 | (JP) | ................. | 2000-081239 |
| Mar. 27, 2000 | (JP) | ................. | 2000-085564 |
| Mar. 29, 2000 | (JP) | ................. | 2000-090496 |
| Jan. 18, 2001 | (JP) | ................. | 2001-010864 |

(51) Int. Cl.$^7$ ............................................. G11C 11/15
(52) U.S. Cl. ....................... 365/173; 365/171; 257/421
(58) Field of Search ...................... 365/173, 171, 365/158, 157, 145; 257/295, 421

(56) References Cited

U.S. PATENT DOCUMENTS

| 5,659,499 A | | 8/1997 | Chen et al. ................. 365/158 |
| 5,764,567 A | * | 6/1998 | Parkin ......................... 365/173 |
| 5,940,319 A | | 8/1999 | Durlam et al. ............... 365/171 |
| 5,953,248 A | * | 9/1999 | Chen et al. ................. 365/158 |
| 6,172,904 B1 | * | 1/2001 | Anthony et al. ............ 365/173 |
| 6,211,559 B1 | * | 4/2001 | Zhu et al. .................... 257/421 |
| 6,233,172 B1 | * | 5/2001 | Chen et al. ................. 365/173 |
| 6,252,796 B1 | * | 6/2001 | Lenssen et al. ............. 365/173 |

FOREIGN PATENT DOCUMENTS

| JP | 9-106514 | 4/1997 |
| JP | 11-161919 | 6/1999 |

* cited by examiner

Primary Examiner—Tan T. Nguyen
(74) Attorney, Agent, or Firm—Dike, Bronstein, et al.; David G. Conlin

(57) ABSTRACT

In a magnetic memory of the present invention which includes a magnetic memory element composed of at least a first ferromagnetic layer, a non-magnetic layer and a second ferromagnetic layer stacked, a third ferromagnetic layer is provided via at least one conductor layer, on one side of the second ferromagnetic layer the other side being closer to the non-magnetic layer. The magnetic memory elements can thereby be provided via a smaller interval in-between, thereby realizing a magnetic memory having higher density than a conventional magnetic memory. Further, the first conductor layer for supplying a current to provide magnetization information can be disposed in the vicinity of the second ferromagnetic layer as a storage layer, thereby providing a magnetic memory capable of generating magnetic poles sufficient to reverse magnetization even by a small current, and low power consumption.

30 Claims, 32 Drawing Sheets

F I G. 1
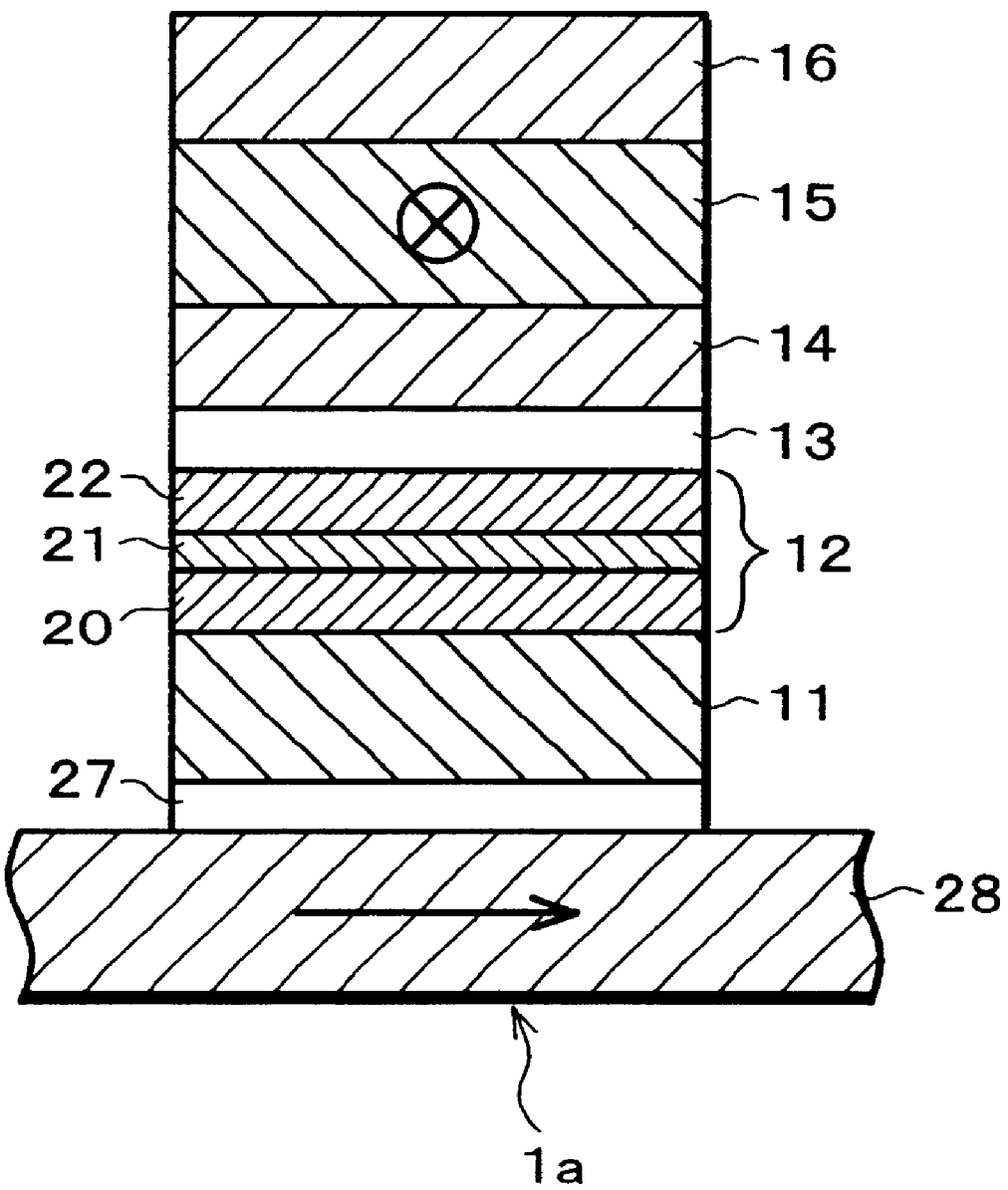

MAGNETIC MEMORY ELEMENT, MAGNETIC MEMORY AND MANUFACTURING METHOD OF MAGNETIC MEMORY

FIELD OF THE INVENTION

The present invention relates to a magnetic memory capable of magneto-resistive reproduction of recorded information and a manufacturing method thereof, and in particular to a magnetic memory element in which stable magnetization exists in a storage layer despite high density, a magnetic memory and the manufacturing method thereof.

BACKGROUND OF THE INVENTION

In recent years, an application of elements such as an Anisotropy Magneto Resistive (AMR) element, a Giant Magneto Resistive (GMR) element and a Magnetic Tunnel Junction (MTJ) element to an HDD reproducing head and a magnetic memory has been proposed. The magnetic memory, like a semiconductor memory, is a solid-state memory having no operation sections, and when compared to the semiconductor memory, the magnetic memory has a number of merits such that (a) it loses no information upon power-down, (b) it is available for the unlimited number of repeated use, and (c) it prevents the storage content thereof from being destroyed by an incident x-ray.

Particularly, the MTJ element can change to a large extent a resistance rate of change depending on directions of magnetization in a pair of ferromagnetic layers which form the MTJ element. The use of the MTJ element in a memory cell has been expected.

A structure of a conventional MTJ element is disclosed, for example, in Japanese Unexamined Patent Publication No. 106514/1997 (Tokukaihei 9-106514 published on Apr. 22, 1997).

A MTJ element 50, as shown in FIG. 33, is made up of an antiferromagnetic layer 51, a ferromagnetic layer 52, an insulating layer 53 and a ferromagnetic layer 54, which are stacked.

The antiferromagnetic layer 51 is made of an alloy such as FeMn, NiMn, PtMn and IrMn. The ferromagnetic layers 52 and 54 are made of Fe, Co or Ni, or an alloy thereof. Further, as a material of the insulating layer 53, the use of various oxides or nitrides has been examined, among which the use of an $Al_2O_3$ film is known to produce the highest magneto-resistive (MR) ratio.

Furthermore, other than the foregoing, there has been proposed a MTJ element which utilizes a difference in coercive force between the ferromagnetic layers 52 and 54 in a structure excluding the antiferromagnetic layer 51.

The principles of the MTJ element 50 when used as a magnetic memory are shown in FIG. 34.

Magnetization in both the ferromagnetic layers 52 and 54 is in-plane magnetization, which is subject to effective uniaxial magnetic anisotropy that directs magnetization either parallel or anti-parallel. In addition, magnetization of the ferromagnetic layer 52 is virtually fixed in one direction due to exchange coupling with the antiferromagnetic layer 51. Further, recording is retained in a direction of magnetization in the ferromagnetic layer 54 which flexibly varies within a range of the uniaxial magnetic anisotropy. Note that, "anti-parallel" refers to a state of magnetization of the ferromagnetic layers 52 and 54 being parallel to each other and directed opposing each other.

The magnetization of the ferromagnetic layer 54 to be a storage layer has a characteristic that a resistance value of the entire MTJ element 50 varies according to which direction is taken, parallel or anti-parallel to the magnetization of the ferromagnetic layer 52.

Accordingly, when reproducing, the resistance value is detected so as to retrieve information data stored in the MTJ element 50.

Further, when recording, a magnetic field generated by a current wire disposed in a vicinity of the MTJ element 50 is utilized to change the direction of magnetization in the ferromagnetic layer 54, thereby performing writing of data to the MTJ element 50.

Meanwhile, the MTJ element 50 having the foregoing structure generates magnetic poles at both ends, since the ferromagnetic layers 52 and 54 are magnetized in the in-plane direction. As a result, when forming a memory array using the MTJ element 50, magnetostatic interaction occurs between the MTJ element 50 and an adjacent MTJ element. This means that a condition of the adjacent MTJ element has an effect on a characteristic of an individual MTJ element, thus making it difficult to reduce a spacing between the MTJ elements and increase a recording density.

In view of the foregoing problems, Japanese Unexamined Patent Publication No. 161919/1999 (Tokukaihei 11-161919 published on Jun. 18, 1999) discloses a method of reducing an effect of edge magnetic poles.

A structure of the MTJ element 60 which reduces the effect on the edge magnetic poles is shown in FIG. 35. In FIG. 34, a ferromagnetic layer (fixed layer) 62, the direction of magnetization is fixed by being coupled with an antiferromagnetic layer 61, and a ferromagnetic layer (flexible layer) 64 which can flexibly rotate with respect to an external magnetic field are stacked so as to sandwich an insulating layer 63. Furthermore, the ferromagnetic layer 62 has a structure such that a pair of ferromagnetic layers 71 and 73 which are antiferromagnetically coupled sandwich a non-magnetic metallic layer 72. Likewise, the ferromagnetic layer 64 has a structure such that a pair of ferromagnetic layers 74 and 76 which are antiferromagnetically coupled sandwich a non-magnetic metallic layer 75, thereby reducing magnetic poles generated on the edges of both the ferromagnetic layer 64 as the flexible layer and ferromagnetic layer 62 as the fixed layer.

However, the conventional magnetic memory as above has the following problems.

The ferromagnetic layer (flexible layer) 64 which does not adjoin the antiferromagnetic layer is composed of NiFe layer/Ru layer/NiFe layer, and flexibly rotates when an external magnetic field is applied. In the prior art document, non-magnetic metallic layer (Ru layer) 75 has a film the thickness of which is set so that the pair of ferromagnetic layers (NiFe layers) 74 and 76 have the maximum antiferromagnetic coupling strength and slightly different film thicknesses therebetween. When a magnetic field is applied from the outside, the ferromagnetic layer 64 as the flexible layer rotates net magnetization generated due to a difference between the film thicknesses of the pair of ferromagnetic layers (NiFe layers) 74 and 76.

However, a film thickness of the non-magnetic metallic layer (Ru layer) 75 is set so that the pair of ferromagnetic layers (NiFe layers) 74 and 76 have the maximum antiferromagnetic coupling strength therebetween. Therefore, the film thickness of the non-magnetic metallic layer (Ru layer) 75 ranges from 4 Å to 8 Å, that is considerably thin. In this arrangement, formation of a pin hole works in reverse and induces ferromagnetic coupling, and it is thus difficult to obtain stable antiferromagnetic coupling strength. In addition, in order to allow an external magnetic field to reverse a direction of magnetization, the pair of ferromagnetic layers (NiFe layers) 74 and 76 are required to have different film thicknesses. More specifically, when apparent magnetization of the two layers is 0, it is difficult to reverse magnetization, and therefore, magnetization requires to be generated by changing a film thickness. However, a difference in the film thicknesses of the two layers prevents the net magnetization of the externally viewed MTJ element 60 from being reduced to zero. Accordingly, there has been a problem that the conventional magnetic memory cannot provide high-density magnetic memory because a magnetic pole which is generated on an edge of a ferromagnetic layer adversely affects an adjacent magnetic memory element.

Further, when using the MTJ element 60 as a magnetic memory element, a magnetic field which is required to reverse magnetization is generated by the passage of electric current through adjacent conductive wires. However, in the prior art document, no arrangements to reduce power consumption is disclosed.

Furthermore, in the conventional magnetic memory, when adopting the MTJ element 60 as a magnetic head, the MTJ element 60 is used in a state in which an applied magnetic field and the direction of an axis of hard magnetization of the ferromagnetic layer (flexible layer) 64 intersects at a right angle. However, when adopting the MTJ element 60 as a magnetic memory element, it is common that the magnetic field generated from two mutually intersecting conductive wires on the magnetic memory element rotates the magnetization of the ferromagnetic layer (flexible layer) 64. This causes an applied magnetic field to incline its direction to the direction of the axis of the hard magnetization of the ferromagnetic layer (flexible layer) 64. Consequently, it is unlikely that such a simple reversal of magnetization due to the rotation of magnetization as disclosed in the prior art document actually takes place, which prevents an element having this arrangement from being used as a magnetic memory element.

SUMMARY OF THE INVENTION

In view of the foregoing problems, it is an object of the present invention to provide (i) a magnetic memory element which is capable of maintaining stable magnetization stored in a storage layer, and low power consumption, (ii) a magnetic memory having this magnetic memory element, and (iii) a manufacturing method of the magnetic memory.

In order to solve the foregoing problems, the magnetic memory according to the present invention has a magnetic memory element including lamination of at least a first ferromagnetic layer, a non-magnetic layer and a second ferromagnetic layer, where a third ferromagnetic layer is provided via at least one conductor layer in-between, on one side of the second ferromagnetic layer the other side of which is closer to the non-magnetic layer.

Further, in order to solve the foregoing problems, the magnetic memory of the present invention includes a plurality of ferromagnetic layers having uniaxial anisotropic in-plane magnetization and an insulating layer on axes in parallel with each other, and utilizes a tunnel effect so as to reproduce magnetization information, and the magnetic memory further includes a first ferromagnetic layer as being a fixed layer and a second ferromagnetic layer as being a storage layer among the plurality of ferromagnetic layers; and a first conductor layer for supplying a current between the second ferromagnetic layer and a third ferromagnetic layer which flexibly reverses a direction of magnetization, wherein the first conductor layer supplies a current in a direction perpendicular to a direction of magnetization in the first ferromagnetic layer.

With the foregoing arrangement, magnetization information is stored in the magnetic memory when a current flowing through the first conductor layer applies a magnetic field to the second ferromagnetic layer as being a storage layer. Magnetization given to the second ferromagnetic layer as being the storage layer and magnetization given to the third ferromagnetic layer, which is formed on the opposite side via the first conductor layer in-between, cancel each other out in opposite directions. More specifically, to the second and third ferromagnetic layers located on and under the first conductor layer, respectively, are applied magnetic fields of opposite directions according to the corkscrew rule, thereby causing magnetization in the two ferromagnetic layers to face opposite directions. Thus, the magnetization in the second and third ferromagnetic layers cancel each other out, thereby reducing apparent magnetization in the magnetic memory element and therefore reducing a possible adverse effect over adjacent magnetic memories.

Accordingly, the magnetic memory elements can be disposed while reducing an interval therebetween, thereby realizing a magnetic memory having higher density than a conventional magnetic memory. Moreover, the first conductor layer, which supplies a current to provide magnetization information, may be provided in the vicinity of the second ferromagnetic layer as being the storage layer, thereby providing a magnetic memory capable of generation of a magnetic field sufficient for reversing magnetization even with a small current, and therefore low power consumption.

In order to solve the foregoing problems, a manufacturing method of the magnetic memory of the present invention which includes a plurality of magnetic memory elements having lamination of at least a first ferromagnetic layer, a non-magnetic layer and a second ferromagnetic layer as being a storage layer, the method including the steps of: forming a laminated film composed of at least the first ferromagnetic layer, the non-magnetic layer and the second ferromagnetic layer in this order from the side of a substrate successively on the substrate; processing the laminated film into the shape of each of the plurality of magnetic memory element which is separated from the others; forming an insulating layer so as to fill a spacing among the plurality of magnetic memory elements formed on the substrate; forming a conductor layer and a third ferromagnetic layer successively on the insulating layer provided over and between the plurality of magnetic memory elements; and processing the conductor layer so that the adjacent magnetic memory elements are coupled only in one direction, after processing the third ferromagnetic layer into substantially the same shape of each of the magnetic memory elements.

Further, in order to solve the foregoing problems, the manufacturing method of the magnetic memory has a plurality of magnetic memory elements having lamination of at least a first ferromagnetic layer, a non-magnetic layer and a second ferromagnetic layer as being a storage layer, the method including the steps of: forming a laminated film composed of at least the first ferromagnetic layer, the non-magnetic layer and the second ferromagnetic layer in this order from the side of a substrate successively on the substrate; processing the laminated film into the shape of each of the plurality of magnetic memory element which is separated from the others; forming an insulating layer so as to fill a spacing among the plurality of magnetic memory elements formed on the substrate; forming a first conductor layer and an insulating layer successively on the insulating layer provided over and between the plurality of magnetic memory elements; processing the first conductor layer so that the adjacent magnetic memory elements are coupled only in one direction; forming an insulating layer so as to fill a spacing around the processed first conductor layer; forming a second conductor layer and a third ferromagnetic layer successively on the insulating layer provided over and between the processed first conductor layer; and processing the second conductor layer so that the adjacent magnetic memory elements are coupled only in a direction orthogonally intersecting the first conductor layer, after processing the third ferromagnetic layer into substantially the same shape of the magnetic memory element.

Further, in order to solve the foregoing problems, a manufacturing method of the magnetic memory of the present invention which includes lamination of a plurality of ferromagnetic layers and an insulating layer, and a storage portion to store magnetization information, and detects a change in resistance in a current flowing through the storage portion according to a tunnel effect, the method including the steps of: forming a third ferromagnetic layer having uniaxial anisotropic in-plane magnetization on a substrate; forming a first conductor layer for supplying a current by being coupled with magnetic memory elements adjacent to each other in a direction orthogonally intersecting a direction of magnetization in said third ferromagnetic layer; forming an insulating layer so as to cover an upper surface of said first conductor layer and fill spacings among said magnetic memory elements; forming a third conductor layer as being a lower electrode for detecting said change in resistance; forming a storage portion including a ferromagnetic layer having uniaxial anisotropic in-plane magnetization, and an insulating layer on an axis parallel to magnetization in the third ferromagnetic layer; and forming a second conductor layer, as being an upper electrode which detects said change in resistance, for supplying a current by being coupled with the magnetic memory elements adjacently provided in a direction parallel to the direction of magnetization in said third ferromagnetic layer.

With the foregoing method, apparent magnetization in every magnetic memory element composing the magnetic memory can be made smaller than that of a conventional magnetic memory, thereby maintaining stable magnetization in the storage layer even in the magnetic memory having the magnetic memory elements closely disposed, thus attaining a magnetic memory with higher density than a conventional magnetic memory.

More specifically, magnetization information is stored in the magnetic memory in such a manner that a synthetic magnetic field of magnetic fields, one of which is generated from a current flowing through the first conductor layer and the other from a current flowing through the second conductor layer, is provided to the third ferromagnetic layer and a ferromagnetic layer which is a storage layer making up a storage portion.

The first conductor layer is located between the third ferromagnetic layer and the storage portion. Therefore, according to the corkscrew rule, the current flowing through the first conductor layer provides the third ferromagnetic layer and the storage portion with magnetic fields having directions opposite to each other. In addition, the second conductor layer is located at the top of lamination, thereby feeding a current in a direction parallel to the direction of magnetization in the first ferromagnetic layer. This makes a magnetic field given from the second conductor layer directed perpendicular to the direction of magnetization in the third ferromagnetic layer and the storage portion.

Furthermore, the third ferromagnetic layer and a ferromagnetic layer of the storage portion have in-plane magnetization which has parallel uniaxial anisotropy. Therefore, a synthetic magnetic field of the magnetic fields generated from currents flowing through the first and second conductor layers that was provided to the third ferromagnetic layer and the ferromagnetic layer of the storage portion turns to the opposite direction on one axis. As a result, magnetization in the third ferromagnetic layer and that in the ferromagnetic layer of the storage portion becomes anti-parallel. The magnetization information stored in the ferromagnetic layer of the storage portion is maintained until further magnetization information to be stored next is provided. Therefore, the second and third ferromagnetic layers remain in a state of canceling each other out in the magnetic memory element, thereby allowing the magnetic memory elements to individually have smaller apparent magnetization than a conventional magnetic memory element.

Accordingly, even when having a fine pattern by reducing an interval between the magnetic memory elements composing the magnetic memory, an adverse effect over adjacent magnetic memory elements becomes less feasible, thereby providing a magnetic memory with higher density.

Additional objects, features, and strengths of the present invention will be made clear by the description below. Further, the advantages of the present invention will be evident from the following explanation in reference to the drawings.

BRIEF DESCRIPTION OF THE DRAWINGS

FIG. 1 is a schematic view showing one embodiment of a magnetic memory element according to the present invention.

DESCRIPTION OF THE EMBODIMENTS

First Embodiment

The following will explain one embodiment of a magnetic memory according to the present invention with reference to FIGS. 1 to 9.

Figure 2:
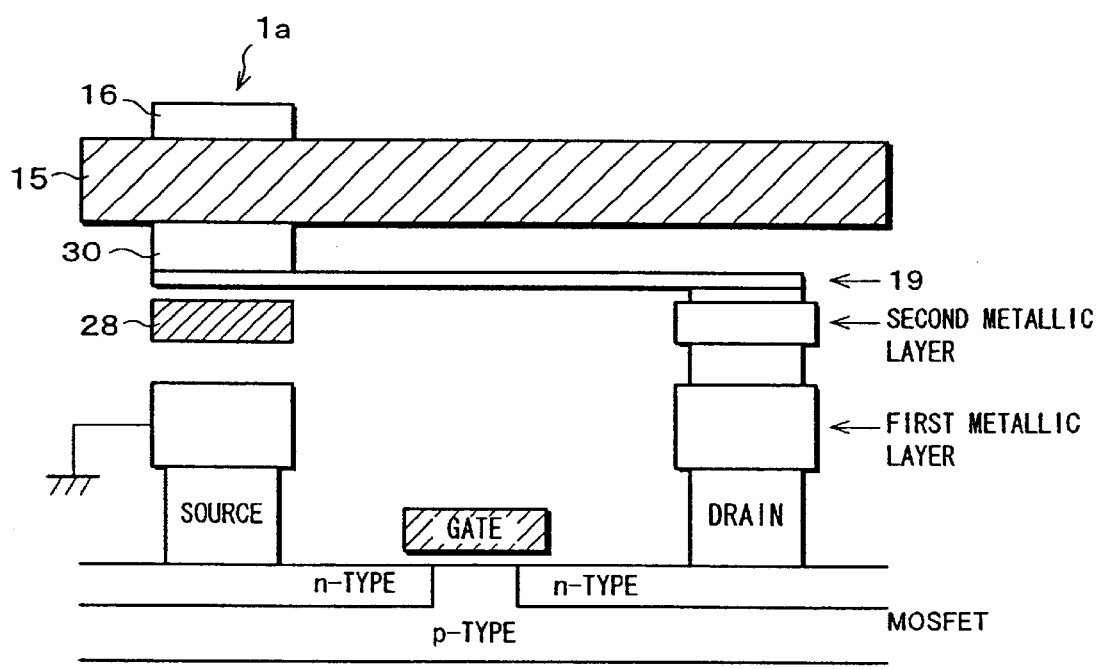
FIG. 2 is a schematic view of a magnetic memory adopting the magnetic memory element of FIG. 1.
Figure 3:
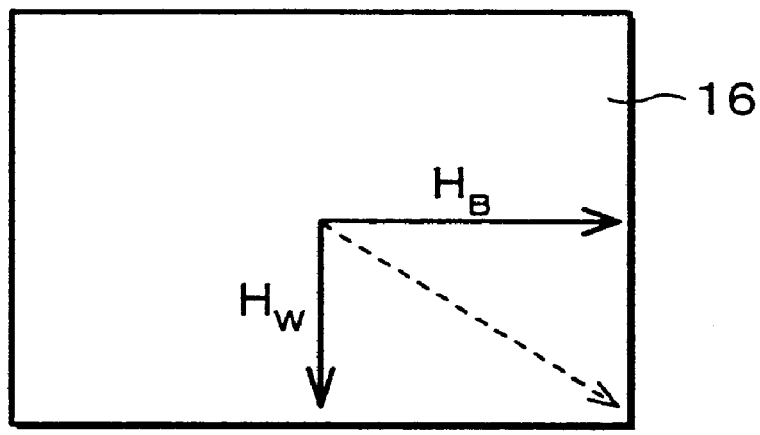
FIGS. 3(a) and 3(b) are plan views showing a magnetic field which is generated in a ferromagnetic layer in a film structure of FIG. 1.
Figure 3:
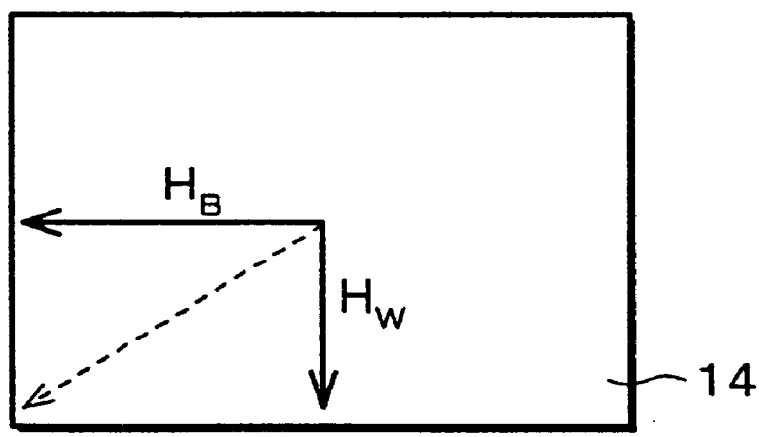

A magnetic memory element 1a, as shown in FIG. 2, is an MTJ element including a conductor layer (second conductor layer) 18, an insulating layer 24, a conductor layer (third conductor layer: lower electrode) 19, a storage portion 30, a conductor layer (first conductor layer) 15 and a ferromagnetic layer (third ferromagnetic layer) 16, which are laminated in this order.

The magnetic memory element 1a according to the present embodiment, as shown in FIG. 1, is the MTJ element which includes a conductor layer 28, an insulating layer 27, an antiferromagnetic layer 11, a ferromagnetic layer (a first ferromagnetic layer: fixed layer) 12, an insulating layer (non-magnetic layer) 13, a ferromagnetic layer (a second ferromagnetic layer: storage layer) 14, a conductor layer 15 and a ferromagnetic layer (a third ferromagnetic layer) 16.

In this magnetic memory element 1a, the ferromagnetic layer (fixed layer) 12 is further made up of three laminated films: a ferromagnetic layer 20, a metallic layer 21 and a ferromagnetic layer 22. The metallic layer 21 has a film thickness which is determined so that the ferromagnetic layers 20 and 22 are antiferromagnetically coupled with each other and have substantially the same magnetization. The ferromagnetic layers 20 and 22 are selected to have substantially the same magnetization. The ferromagnetic layer 12 may be made of a single-layer ferromagnetic substance; however, having the foregoing laminated structure can virtually reduce apparent magnetization to zero.

The ferromagnetic layers 14 and 16 are given uniaxial anisotropy on an axis in parallel with a direction of magnetization in the ferromagnetic layer 12, and the antiferromagnetic layer 11 and the ferromagnetic layer 20 are subjected to exchange coupling.

In the magnetic memory element 1a, a direction of magnetization in the ferromagnetic layer 22 composing the ferromagnetic layer 12 and that of the ferromagnetic layer 14 are set to be in two different states: parallel or anti-parallel to each other. A value of current flow through the magnetic memory element 1a in a direction of lamination varies depending on whether the direction of magnetization in the ferromagnetic layer 12 and that in the ferromagnetic layer 22 are parallel or anti-parallel. The magnetic memory of the present embodiment detects this change in electric resistance so as to detect a direction of magnetization stored in the storage layer, thereby performing reproducing.

Further, the conductor layer 15 serves as both a bit line and an electrode for detecting a change in resistance, and is connected to another magnetic memory element adjacent thereto via a spacing determined by wiring rules in-between. The conductor layer 18 is a word line.

Here, as shown in FIG. 1, the conductor layer 15 is fed a current perpendicular to the direction of magnetization in the ferromagnetic layer 12 and along a laminated surface, and the conductor layer 28 is fed a current parallel to the direction of magnetization in the ferromagnetic layer 12. In that case, as shown in FIGS. 3(a) and 3(b), in the positions of the ferromagnetic layers 14 and 16 are applied a synthetic magnetic field of a magnetic field $H_B$ generated from current flow through the conductor layer 15 and a magnetic field $H_W$ generated from current flow through the conductor layer 18. As shown in FIGS. 3(a) and 3(b), since a direction of the synthetic magnetic field is different in the positions of the ferromagnetic layers 14 and 16, respectively, the ferromagnetic layers 14 and 16, that have been given uniaxial anisotropy on an axis in parallel with the direction of magnetization in the ferromagnetic layer 12, are magnetized opposing to each other. Consequently, the magnetization of the ferromagnetic layer 14 is stabilized by a magnetic field produced by a magnetic pole generated on both ends of the ferromagnetic layer 16. Furthermore, as in the case of the magnetic memory of the present embodiment, adjusting the ferromagnetic layers 14 and 16 to have the same amount of magnetic moment prevents apparent magnetization with respect to the outside and an adverse effect on an adjacent magnetic memory element.

Furthermore, the magnetic memory element 1a has an arrangement in which the ferromagnetic layers 14 and 16 directly contact the conductor layer 15. By thus arranging the conductor layer 15 and the ferromagnetic layers 14 and 16 to be disposed in the vicinity, even a small current can provide the ferromagnetic layers 14 and 16 with a sufficient magnetic field strength, thereby realizing lower power consumption in a magnetic memory element.

Note that, in the present embodiment, the ferromagnetic layers 14 and 16 have the same magnetic moment; however, the magnitude of magnetic moment is not limited to this. Even when there is a difference in the magnitude of magnetic moment between the ferromagnetic layers 14 and 16, they act so as to cancel each other out, thereby reducing the magnitude of apparent magnetization unlike a conventional magnetic memory without ferromagnetic layer 16. It should be noted that the ferromagnetic layers 14 and 16 preferably have magnetic moment of the same magnitude as in the present embodiment so as to reduce apparent magnetization in a magnetic memory to zero and surely prevent the apparent magnetization from adversely affecting an adjacent magnetic memory element.

Figure 9:
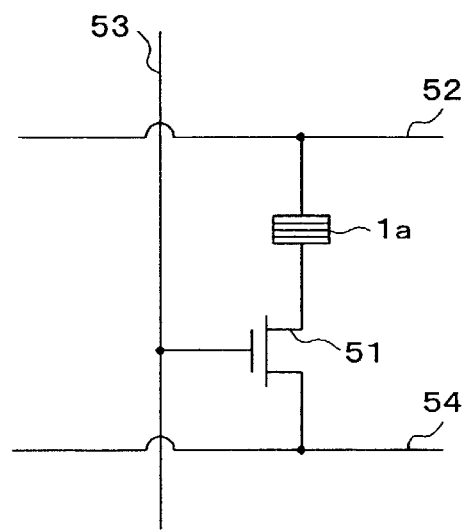
FIG. 9 is a schematic view showing a magnetic memory adopting a MTJ element of the present invention.

Next, FIG. 9 is a schematic view showing an example of the magnetic memory element 1a of the present embodiment used in a random-accessible magnetic memory.

A transistor 51 selects a magnetic memory element 1a to be reproduced when reproducing the stored magnetization information. Information such as '0' and '1' is stored in the direction of magnetization in the ferromagnetic layer 14 of the magnetic memory element 1a shown in FIG. 1, and the direction of magnetization in the ferromagnetic layer 12 is fixed. In addition, the present magnetic memory element 1a reproduces the stored magnetization information by utilizing a magneto-resistive effect such that a value of resistance becomes low when the respective directions of magnetization in the ferromagnetic layer 12 (ferromagnetic layer 22) and the ferromagnetic layer 14 are parallel, while a value of resistance becomes high when the directions of magnetization in the layers 12 (22) and 14 are anti-parallel.

On the other hand, recording into a magnetic memory is achieved by allowing a synthetic magnetic field formed by a bit line 52 shown in FIG. 9 and a write-use word line (not shown) to change a direction of magnetization of the ferromagnetic layers 14 and 16 in accordance with storage information. Note that, a member given a reference numeral '54' is a plate line.

Figure 4:
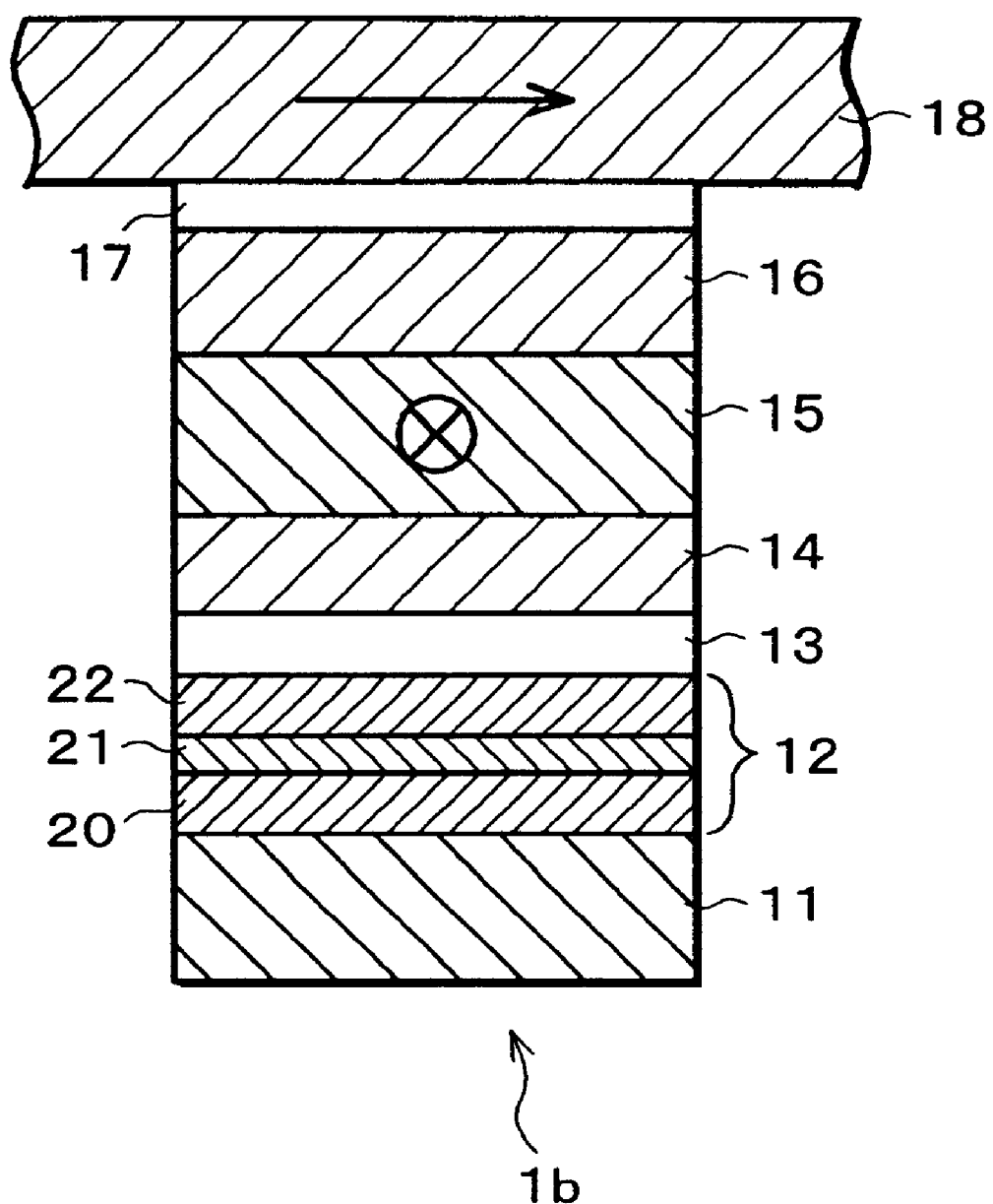
FIG. 4 is a schematic view of another embodiment of the magnetic memory element of the present invention.

Further, a modification example of the magnetic memory element 1a of the magnetic memory according to the present embodiment has an arrangement as with a magnetic memory element 1b as shown in FIG. 4 in which the conductor layer 18 is provided on the top of the layers, i.e., on one side opposite to the antiferromagnetic layer 11 when viewed from the second ferromagnetic layer 14 as being the storage layer. With this arrangement, an effect similar to that of the magnetic memory of the present embodiment can be obtained.

Figure 5A:
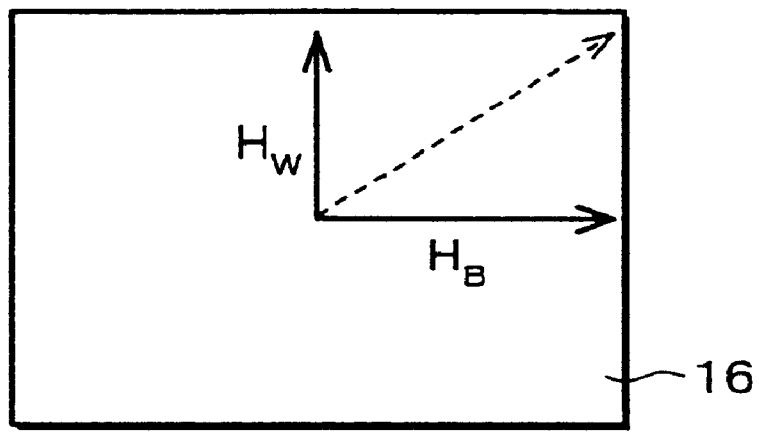
FIGS. 5(a) and 5(b) are plan views showing a magnetic field which is generated in a ferromagnetic layer in a film structure of FIG. 4.
Figure 5B:
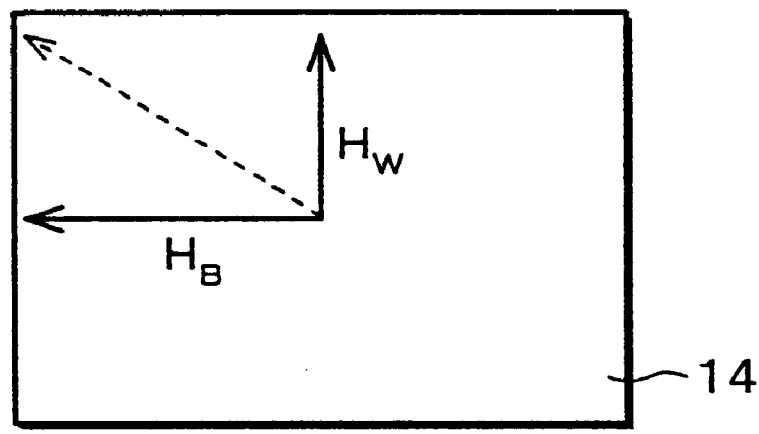

A magnetic field which is generated in the positions of the ferromagnetic layers 14 and 16 due to two streams of current flowing through the conductor layers 15 and 18 is directed opposite as shown in FIG. 5. Therefore, as in the case of the magnetic memory element 1a of FIG. 1, the magnetization in the ferromagnetic layer 14 is stabilized by a magnetic field formed by magnetic poles at both ends of the ferromagnetic layer 16.

Here, the following will explain lamination materials which composes the foregoing magnetic memory.

Materials for the antiferromagnetic layer 11 include alloys such as FeMn, NiMn, PtMn and IrMn.

Materials for the ferromagnetic layers 12, 14 and 16 include Fe, Co and Ni, and alloys thereof.

In addition, it is preferable that the ferromagnetic layers 12, 14 and 16 respectively have a film thickness of not less than 10 Å. An exceedingly thin film leads to superparamagnetization under the effect of thermal energy. That is why a ferromagnetic layer is preferred to have a film thickness of not less than 10 Å.

As the insulating layer 13, in view of an MR ratio, an $Al_2O_3$ film is preferable; however, an insulating film of another oxide film or nitride film, or an insulating film such as an Si film, a diamond film and a diamond-like carbon (DLC) film may also be adopted.

In addition, it is preferable that the insulating layer 13 has a film thickness of not less than 3 Å and not more than 30 Å because, when the insulating film 13 has a film thickness of less than 3 Å, the ferromagnetic layers 12 and 14 may possibly be short-circuited electrically, and further, when the insulating layer 13 has a film thickness of more than 30 Å, an electron is substantially free from a tunnel effect, thereby reducing a ratio of magnetic reluctance.

Figure 6:
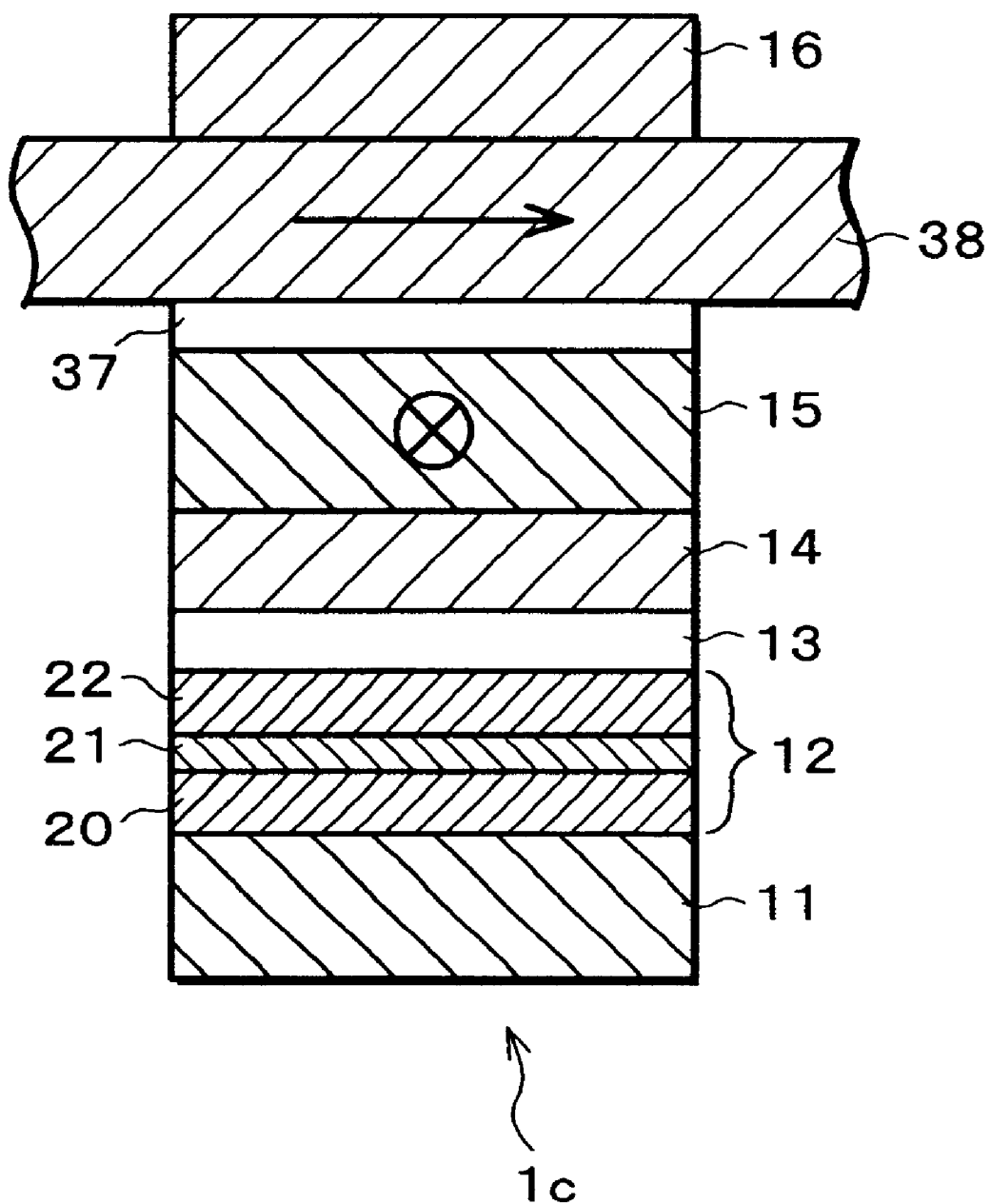
FIG. 6 is a schematic view showing yet another embodiment of the magnetic memory element of the present invention.

Next, FIG. 6 is another modification example of the magnetic memory of the present embodiment.

As shown in FIG. 6, a magnetic memory element 1c according to the present embodiment is an MTJ element like the magnetic memory element 1a and includes the antiferromagnetic layer 11, the ferromagnetic layer 12, the insulating layer 13, the ferromagnetic layer 14, the conductor layer 15, an insulating layer 37, a conductor layer 38 and the ferromagnetic layer 16. The ferromagnetic layers 14 and 16 are given uniaxial anisotropy on an axis in parallel with the direction of magnetization in the ferromagnetic layer 12. Further, as in the magnetic memory element 1a, the ferromagnetic layer 12 is a laminated film, and the antiferromagnetic layer 11 and the ferromagnetic layer 20 are subjected to exchange coupling. Note that, the materials for the layers and film thicknesses of the magnetic memory element 1a may be applicable here.

The magnetic memory element 1c has an arrangement in which a current flows through the conductor layer 15 perpendicularly to the direction of magnetization in the ferromagnetic layer 12, and a current flows through the conductor layer 38 in parallel with the direction of magnetization in the ferromagnetic layer 12. In the positions of the ferromagnetic layers 14 and 16, as shown in FIGS. 7(a) and 7(b), is applied a synthetic magnetic field of a magnetic field $H_B$ and a magnetic field $H_W$ formed by the respective currents flowing through the conductor layers 15 and 38.

With this arrangement, the synthetic magnetic field applied to the ferromagnetic layers 14 and 16 becomes substantially anti-parallel. As a result, magnetic poles which are generated in the ferromagnetic layers during a process before recording when magnetization is reversed act in such a direction as to mutually induce the reversal of magnetization, thereby further reducing a storage current than the magnetic memory element 1a.

Figure 7:
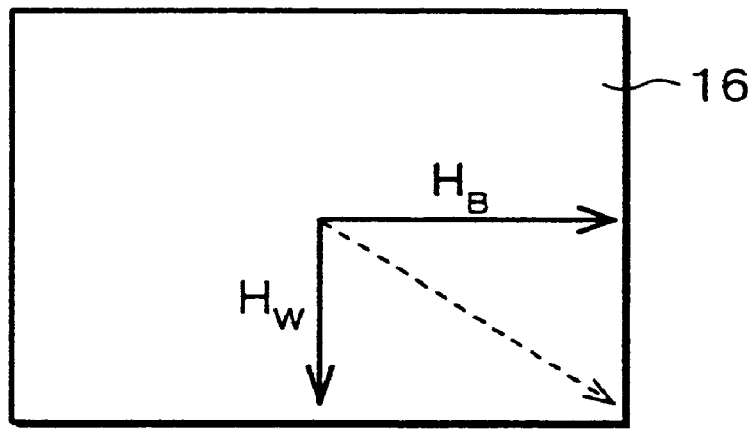
FIGS. 7(a) and 7(b) are plan views showing a magnetic field which is generated in a ferromagnetic layer in a film structure of FIG. 6.
Figure 7:
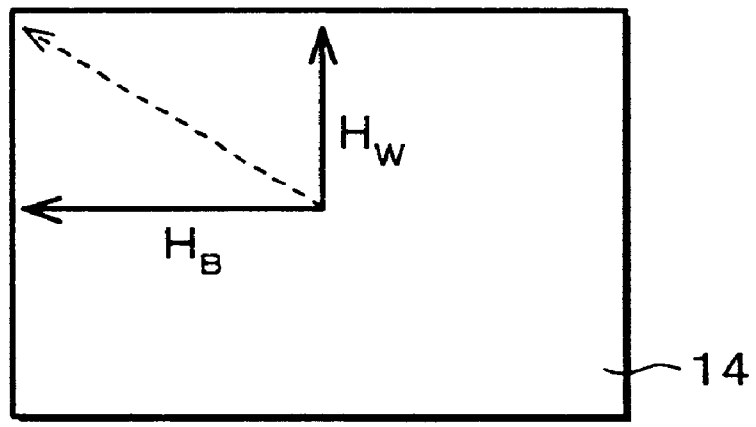
Figure 8:
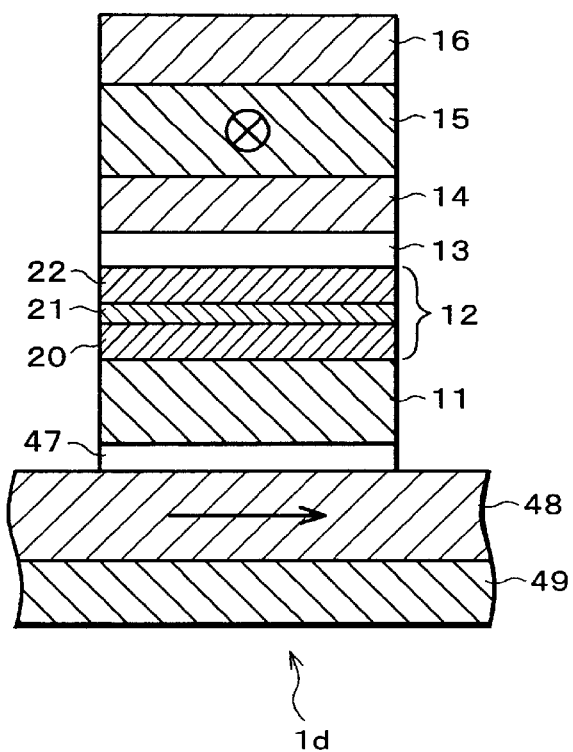
FIG. 8 is a schematic view showing still another embodiment of the magnetic memory element of the present invention.

Next, FIG. 7 shows yet another modification example of the magnetic memory element 1a of the present embodiment.

A magnetic memory element 1*d* is an MTJ element like the magnetic memory element 1*a* and includes the antiferromagnetic layer 11, the ferromagnetic layer 12, the insulating layer 13, the ferromagnetic layer 14, the conductor layer 15, the ferromagnetic layer 16, an insulating layer 47, a conductor layer 48 and a ferromagnetic layer 49. The ferromagnetic layers 14 and 16 are given uniaxial anisotropy on an axis in parallel with the direction of magnetization in the ferromagnetic layer 12. Further, as in the magnetic memory element 1*a*, the ferromagnetic layer 12 is a laminated film, and the antiferromagnetic layer 11 and the ferromagnetic layer 20 are subjected to exchange coupling. Note that, the materials for the layers and film thicknesses of the magnetic memory element 1*a* may be applicable here.

The magnetic memory element 1*d* has an arrangement in which a current flows through the conductor layer 15 perpendicularly to the direction of magnetization in the ferromagnetic layer 12, and a current flows through the conductor layer 48 on an axis parallel to the direction of magnetization in the ferromagnetic layer 12.

The direction of a magnetic field to be applied to the ferromagnetic layers 14 and 16 is the same as that in the magnetic memory elements 1*a* to 1*c*.

In the magnetic memory element 1*d*, the ferromagnetic layer 49 having high permeability is provided on one side of the conductor layer 48 the other side of which is closer to the antiferromagnetic layer 11. When recording, a current flows through the conductor layer 48 so as to generate a magnetic field, and a magnetic field generated on one side of the conductor layer 48 which is adjacent to the ferromagnetic layer 49 is focused on the ferromagnetic layer 49 due to its high permeability. As a result, a magnetic field generated on the other side of the conductor layer 48 which is adjacent to the insulating layer 47 becomes large, so that feeding the same current increases a magnetic field strength in the positions of the ferromagnetic layers 14 as being a storage layer and 16 compared to the case without the ferromagnetic layer 49, thus reducing power consumption in a magnetic memory compared to the case where a magnetic memory does not have the ferromagnetic layer 49. Note that, with respect to the ferromagnetic layer 49, alloys with high-permeability such as an NiFe alloy, an amorphous alloy of a CoZrNb family and an alloy of an FeAlSi family are applicable.

Further, it has been explained that the magnetic memory element 1*d* has the conductor layer 48 disposed in the vicinity of the antiferromagnetic layer 11; however, the same effect can be obtained when disposing the conductor layer 48 on one side of the ferromagnetic layer 16 via an insulating layer in-between.

As discussed, the magnetic memory element of the present embodiment can stabilize magnetization in the ferromagnetic layer 14 as being a storage layer, and reduce apparent magnetization in the magnetic memory element to smaller than a conventional magnetic memory element, thereby reducing an adverse effect over adjacent magnetic memory elements, thus maintaining a stable magnetizing state even when having a fine pattern and realizing a magnetic memory having higher integration.

Furthermore, the magnetic memory of the present embodiment can reduce more power consumption than a conventional magnetic memory, that is enabled by having the conductor layer 15 for supplying a current for the generation of a magnetic field disposed in the vicinity of the ferromagnetic layer 14 as being a storage layer, and by focusing magnetic fields of the conductor layer 48 on the ferromagnetic layer 14.

Note that, in the present embodiment, explanation has been made through the case where magnetization in the ferromagnetic layer 12 is fixed by exchange coupling with the antiferromagnetic layer 11; however, it is also possible to have a different arrangement without the antiferromagnetic layer 11, which adopts other means such as using a ferromagnetic material having a larger coercive force to compose a ferromagnetic layer as being a fixed layer.

Further, it is preferable, for example, to compose the ferromagnetic layer 12 of a ferrimagnetic material such as a rare earth—transition metal alloy film of a composition near a compensation point, so as to reduce an influence of magnetic poles on an edge of the ferromagnetic layer.

Further, a laminating order of the lamination materials in the present embodiment does not matter, so that it is also possible to have the layers laminated in a retrograde order of the foregoing magnetic memory element.

Furthermore, it is preferable to set a coercive force of the ferromagnetic layer 16 to be smaller than that of the ferromagnetic layer 14 so as to reverse magnetization in the ferromagnetic layer 16 first when recording. This enables the magnetic poles generated on both ends of the ferromagnetic layer 16 to form a magnetic field in such a direction as to accelerate the reversal of the direction of magnetization in the ferromagnetic layer 14, thereby further reducing currents needed for recording.

Further, through the foregoing embodiments have been explained only a magnetic memory element portion; however, other components such as an electrode on a discharging side of currents, a substrate, a protective layer and an absolute contact layer are obviously necessary as well in the actual formation of the element.

Further, through the foregoing embodiments has been explained the MTJ element as an example; however, a GMR element is also applicable by insulating a laminated portion of the antiferromagnetic layer 11, ferromagnetic layer 12, insulating layer (non-magnetic layer) 13 and ferromagnetic layer 14, that forms a memory element portion, from a conductor layer.

Second Embodiment

The following will explain another embodiment of the magnetic memory according to the present invention with reference to FIGS. 10 to 13.

Note that, for ease of explanation, members having the same functions as those shown in the drawings pertaining to the First Embodiment above will be given the same reference numerals, and explanation thereof will be omitted here.

Figure 10:
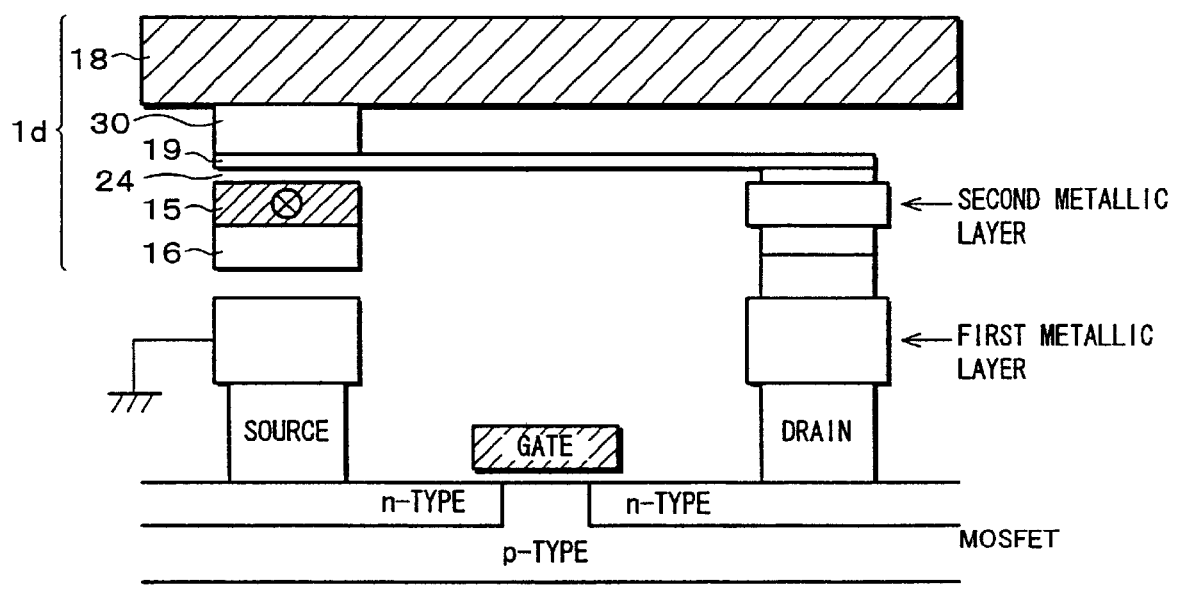
FIG. 10 is a general view of a magnetic memory element manufactured in accordance with one embodiment of a manufacturing method of the magnetic memory of the present invention.

A magnetic memory element 1*e*, as shown in FIG. 10, is an MTJ element made up of the ferromagnetic layer (third ferromagnetic layer) 16, the conductor layer (first conductor layer) 15, an insulating layer 24, a conductor layer (third conductor layer: lower electrode) 19, a storage portion 30, and the conductor layer (second conductor layer) 18, which are stacked in this order.

A magnetic memory of the present embodiment is the magnetic memory for reproducing magnetization information which was stored by a conventionally adopted tunnel effect. In addition, as discussed below, the storage portion 30 for storing magnetization information has the same arrangement as that of a conventional magnetic memory. Particularly, the magnetic memory of the present embodiment has a characteristic such that the conductor layers 19 and 18 that are used when reproducing are laminated together with the other ferromagnetic layers, as the subject matter of the magnetic memory element 1*e*.

The ferromagnetic layer 16 has uniaxial anisotropic in-plane magnetization which is in parallel with uniaxial anisotropic in-plane magnetization of the ferromagnetic layers 14 and 12 to be discussed later.

Further, the conductor layer 15 is a conductor layer which feeds a current in a direction perpendicular to the direction of in-plane magnetization in the ferromagnetic layer 16.

The conductor layer 19 is connected to a drain electrode of a transistor which selects the magnetic memory element 1e for performing recording and reproducing. In addition, the conductor layer 19 is the lower electrode which detects a change in resistance in current flow through the storage portion 30 between the conductor layer 19 and the conductor layer 18 which is to be discussed later, so as to read out magnetization information stored in the magnetic memory element 1e.

Figure 11:
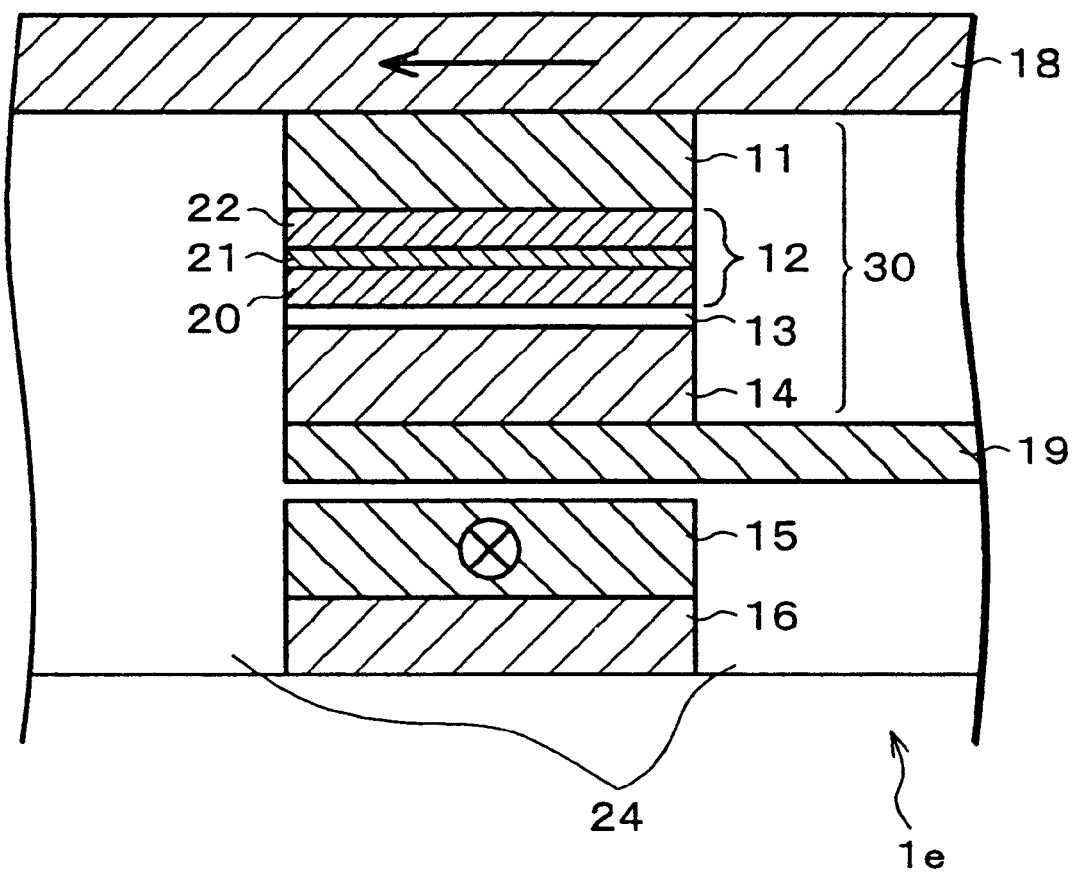
FIG. 11 is a cross sectional view showing details of structure of the magnetic memory element of FIG. 10.

The storage portion 30 has a plurality of ferromagnetic layers including the ferromagnetic layer 14 as a storage layer into which magnetization information to be stored is written, and an insulating layer, where, as shown in FIG. 11, the ferromagnetic layer (second ferromagnetic layer: flexible layer) 14, the insulating layer 13, the ferromagnetic layer (first ferromagnetic layer: fixed layer) 12 and the antiferromagnetic layer 11 are stacked in this order.

The ferromagnetic layer 12 has a triple-layer structure in which ferromagnetic layers 20 and 22 both having substantially the same magnetization sandwich a metallic layer 21. The metallic layer 21 has a film thickness which is set so as to antiferromagnetically couple the ferromagnetic layers 20 and 22, and therefore, apparent magnetization in the ferromagnetic layer 12 is set at 0. In addition, the ferromagnetic layer 12 is exchange-coupled with the adjacent antiferromagnetic layer 11, thereby fixing magnetization in the ferromagnetic layer 22 of the ferromagnetic layer 12 in one direction. Moreover, since the ferromagnetic layers 20 and 22 are antiferromagnetically coupled, the direction of magnetization in the ferromagnetic layer 20 is, as a result, fixed in the opposite direction to the direction of magnetization in the ferromagnetic layer 22.

The conductor layer 18 is connected to an adjacent magnetic memory element via a spacing which is determined in accordance with wiring rules in-between. In addition, as discussed later, the conductor layer 18 plays two parts: one is an upper electrode for detecting a value of resistance which is variable in accordance with the direction of magnetization in the ferromagnetic layer 14 as the storage layer; and the other is a bit line.

Here, the following will explain a recording and reproducing method of the magnetic memory of the present embodiment.

Figure 12A:
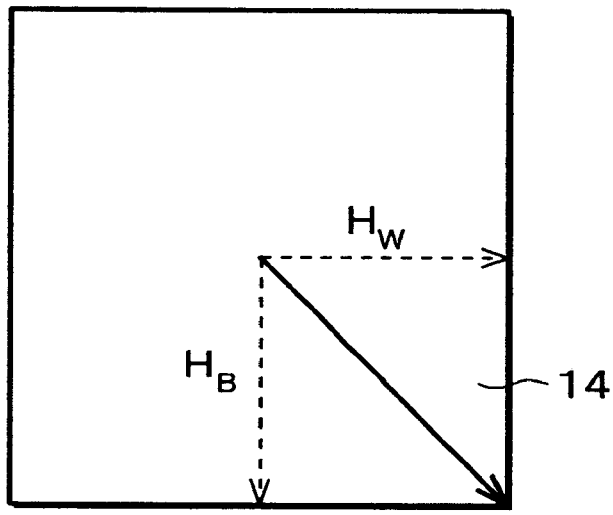
FIGS. 12(a) and 12(b) are plan views showing a direction of a magnetic field which is generated in a ferromagnetic layer of the magnetic memory element of FIG. 11.
Figure 12B:
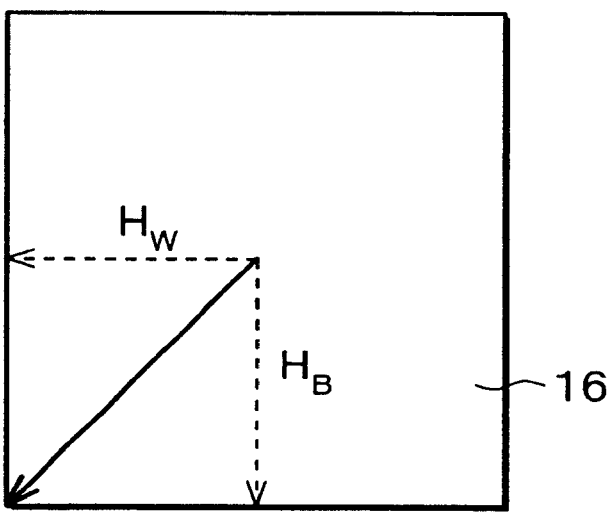

Recording with respect to the magnetic memory element 1e is performed by respectively supplying currents to the orthogonally intersecting conductor layers 15 and 18. The conductor layer 15 feeds a current perpendicularly to the direction of magnetization in the ferromagnetic layer 16, while the conductor layer 18 feeds a current parallel to the direction of magnetization in the ferromagnetic layer 16. In that case, as shown in FIG. 12, with respect to the ferromagnetic layer 14 as being the storage layer is applied a synthetic magnetic field of a magnetic field $H_W$ which is generated from a current flowing through the conductor layer 15 and a magnetic field $H_B$ which is generated from a current flowing through the conductor layer 18. This applied synthetic magnetic field enables the writing of magnetization information to be stored.

On the other hand, reproducing is performed by detecting a value of electrical resistance between the conductor layers 18 and 19, that are the upper and lower electrodes, respectively. This value of electrical resistance varies depending on which state the directions of magnetization in the fixed ferromagnetic layer 20 and the ferromagnetic layer 14 as the storage layer are in, parallel or anti-parallel. More specifically, when the direction of magnetization stored in the ferromagnetic layer 14 is the same as that in the fixed ferromagnetic layer 20, the number of electrons passing through the insulation layer 13 due to the tunnel effect increases so as to reduce electrical resistance. On the contrary, when the direction of magnetization stored in the ferromagnetic layer 14 is opposite to that in the fixed ferromagnetic layer 20, the number of electrons passing through the insulating layer 13 due to the tunnel effect decreases so as to increase electrical resistance. As explained, when reproducing, a voltage is applied to the conductor layers 18 and 19, then, a change in electrical resistance in a current flowing through the storage portion 30 is detected so as to obtain magnetization information in the storage portion 30 as a signal, thus reproducing the stored information.

Particularly, the magnetic memory of the present embodiment has the conductor layer 15 for feeding a current which offers magnetization information when recording, formed between the ferromagnetic layers 14 and 16, that are the storage layer and the flexible layer, respectively. Therefore, the conductor layer 15, according to the corkscrew rule, provides the opposite directions of magnetization to the ferromagnetic layers 14 and 16, that are disposed above and under the conductor layer 15, respectively. Moreover, the ferromagnetic layers 16 and 14 are given the magnetic moment of the same magnitude. This means that the ferromagnetic layer 16 is given magnetization which has the same magnitude as, and the opposite direction of, magnetization information stored in the ferromagnetic layer 14, thereby reducing apparent magnetization in the magnetic memory element 1e to 0.

As discussed, in the magnetic memory of the present embodiment, even when a fine pattern is made by reducing an interval between the magnetic memory elements, magnetization of adjacent magnetic memory elements does not affect the magnetization stored in the storage layer, thereby realizing a magnetic memory capable of stable magnetization in a storage layer even when increasing a storage density. Moreover, the magnetic memory of the present embodiment, unlike a conventional magnetic memory, does not require a magnetic head, thereby performing recording and reproducing by the magnetic memory of the present embodiment alone.

Note that, in the magnetic memory of the present embodiment, explanation has been made through the case where the ferromagnetic layers 14 and 16 are given the magnetic moment of the same magnitude, though not limited to this. Namely, when using a magnetic memory having the same structure as the one in the above, the ferromagnetic layers 14 and 16 are given magnetization in such a direction as to cancel each other out. Accordingly, the magnitude of apparent magnetization in the magnetic memory element 1e becomes smaller than that in a conventional magnetic memory, thereby obtaining a high-density magnetic memory as above. It should be noted that the ferromagnetic layers 14 and 16 more preferably have the magnetic moment of the same magnitude as in the magnetic memory of the present embodiment because apparent magnetization in the magnetic memory element 1e is thereby reduced to 0, thereby completely preventing an adverse effect over adjacent magnetic memory elements.

Figure 13:
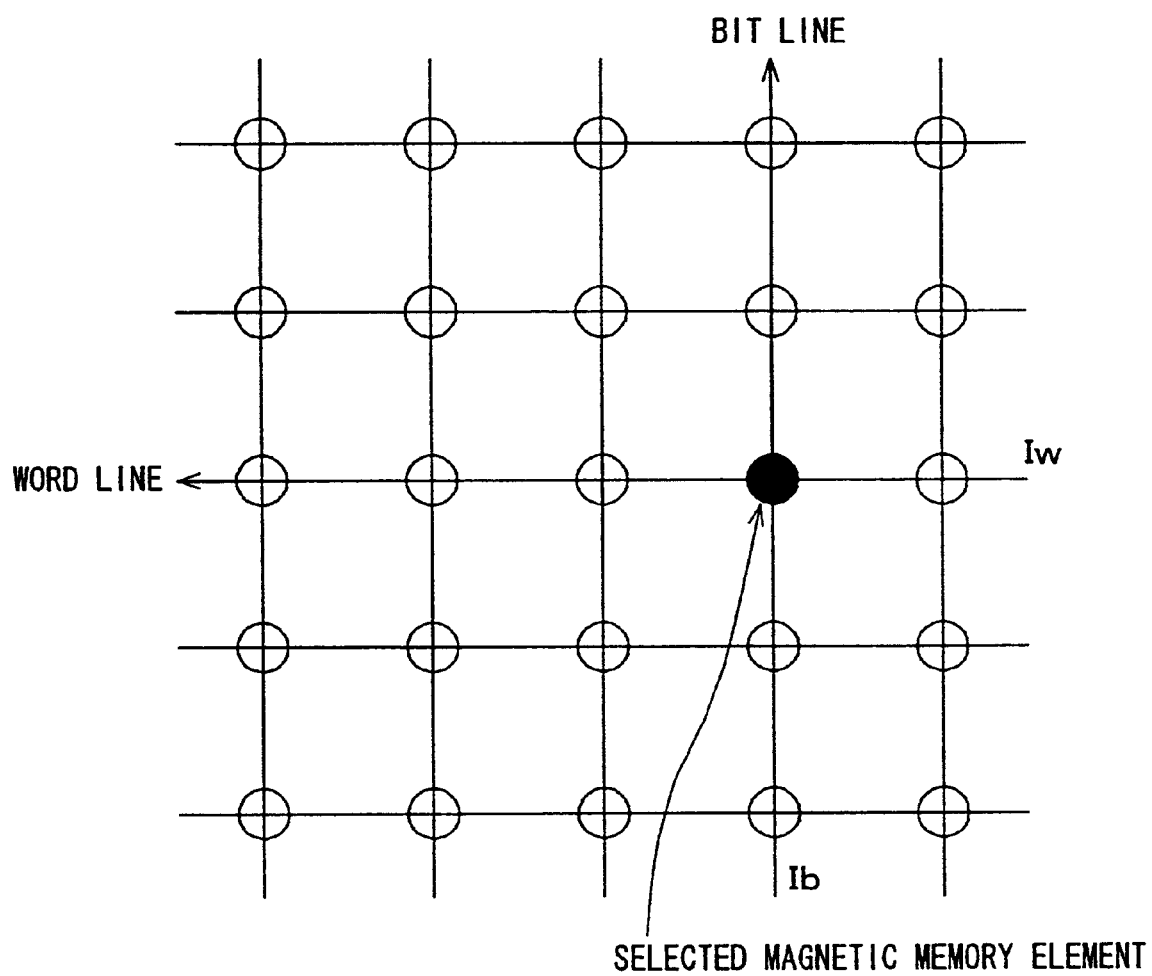
FIG. 13 is a plan view of a magnetic memory in which the magnetic memory element of FIG. 11 is disposed.

Further, as shown in FIG. 13, each of the magnetic memory elements 1e is formed at an intersecting portion of the conductor layers 15 and 18. A magnetic field required to reverse magnetization in the ferromagnetic layers 14 and 16 is larger than the magnetization $H_W$ and $H_B$ that are respectively generated from currents flowing through the conductor layers 15 and 18, and smaller than the synthetic magnetic field of $H_W$ and $H_B$. Accordingly, when feeding currents to the conductor layers 15 and 18 when recording magnetization information, adjacent magnetic memory elements are not adversely affected, thereby making it possible to reverse magnetization only in the magnetic memory elements 1e on the intersecting portions.

Further, when performing recording in the magnetic memory elements 1e, as explained, by changing the direction of a current to be fed to the conductor layer 15 according to magnetization information to be stored, the direction of magnetization to be stored in the storage portion 30 is changed. Since the conductor layer 15 and the storage portion 30 to reverse magnetization are disposed in the vicinity, even a small current can provide a magnetic field which is sufficient to reverse the magnetization in the storage portion 30. Consequently, adopting the arrangement of the magnetic memory of the present embodiment results in a magnetic memory capable of small electric power consumption.

Third Embodiment

The following will explain one embodiment of a manufacturing method of the magnetic memory according to the present invention with reference to FIGS. 14 to 21(a) and 21(b).

Note that, for ease of explanation, members having the same functions as those shown in the drawings pertaining to the First and Second Embodiments above will be given the same reference numerals, and explanation thereof will be omitted here.

Figure 14:
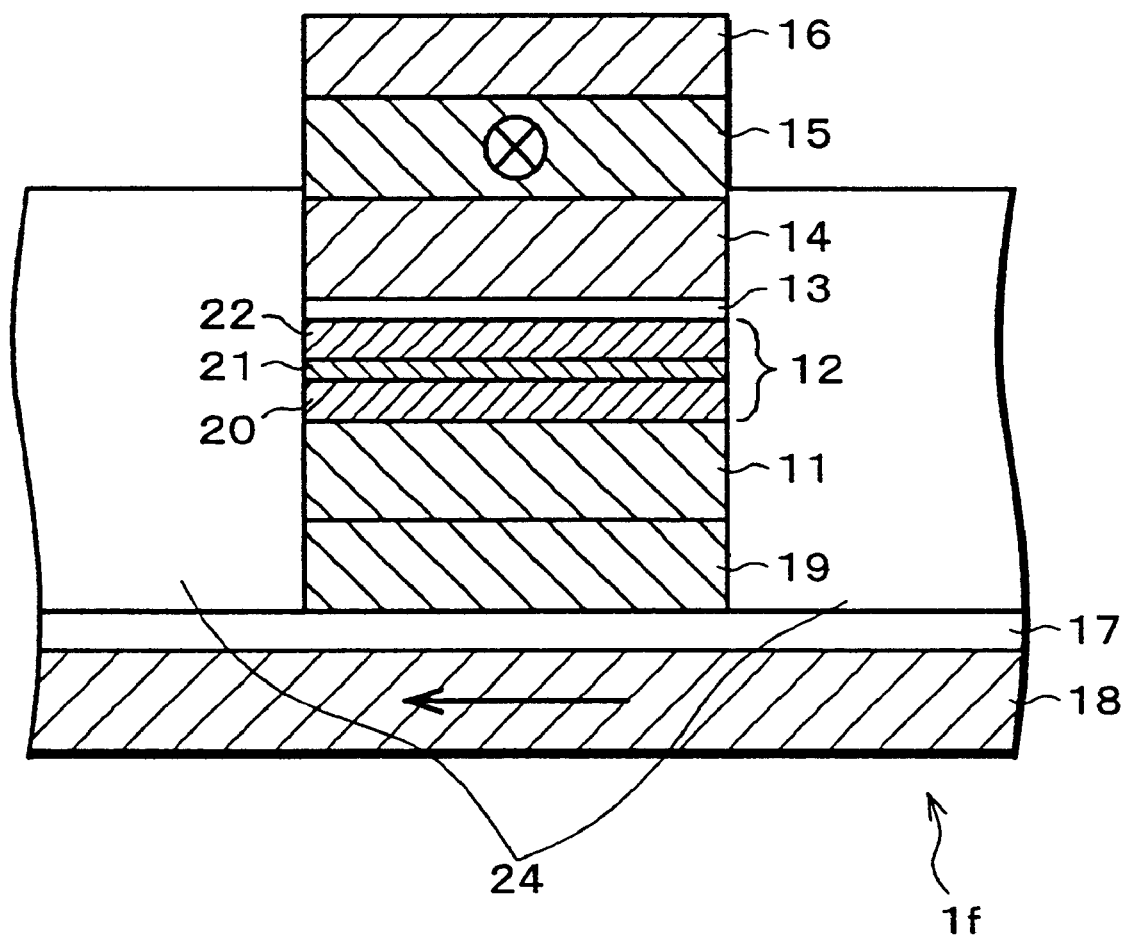
FIG. 14 is a schematic view showing a magnetic memory element manufactured according to the present invention.
Figure 15:
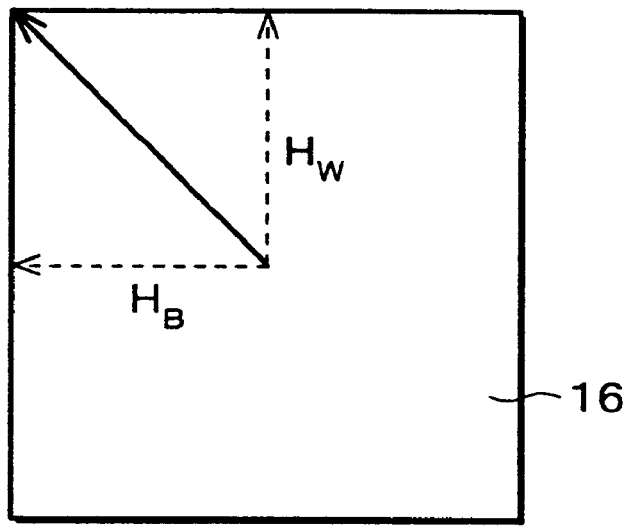
FIGS. 15(a) and 15(b) are plan views showing a magnetic field which is generated in a ferromagnetic layer in a film structure of FIG. 14.
Figure 15:
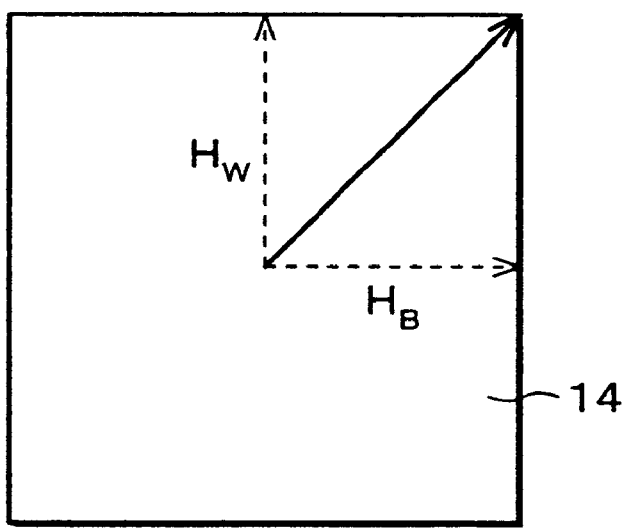
Figure 16:
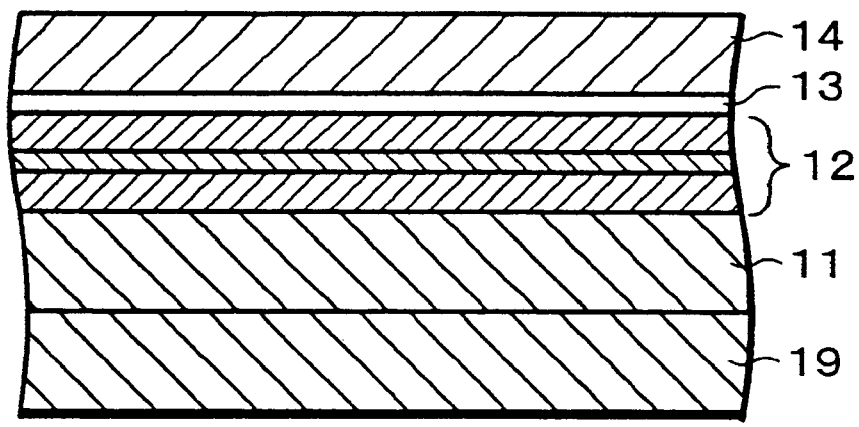
FIGS. 16(a) and 16(b) are explanatory views showing manufacturing processes of a magnetic memory element according to the present invention.
Figure 16:
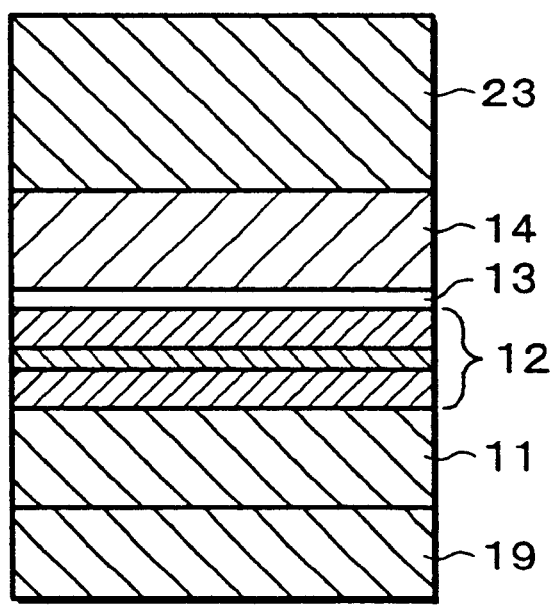
Figure 17:
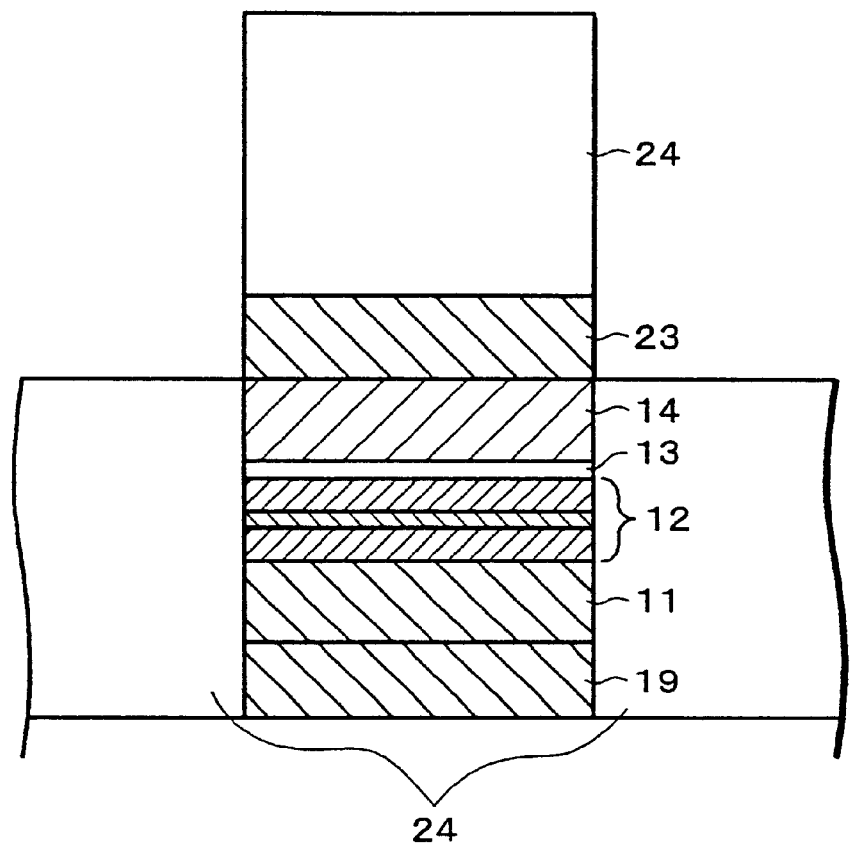
FIGS. 17(a) and 17(b) are explanatory views showing manufacturing processes of the magnetic memory element according to the present invention.
Figure 17:
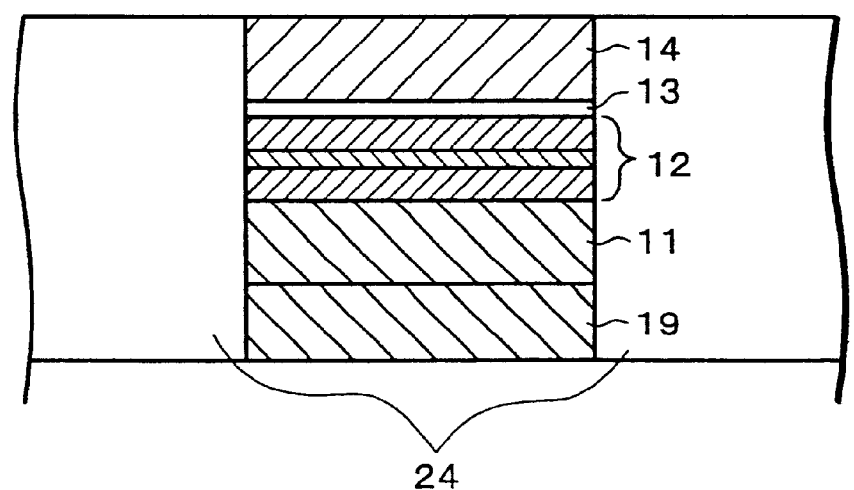
Figure 18:
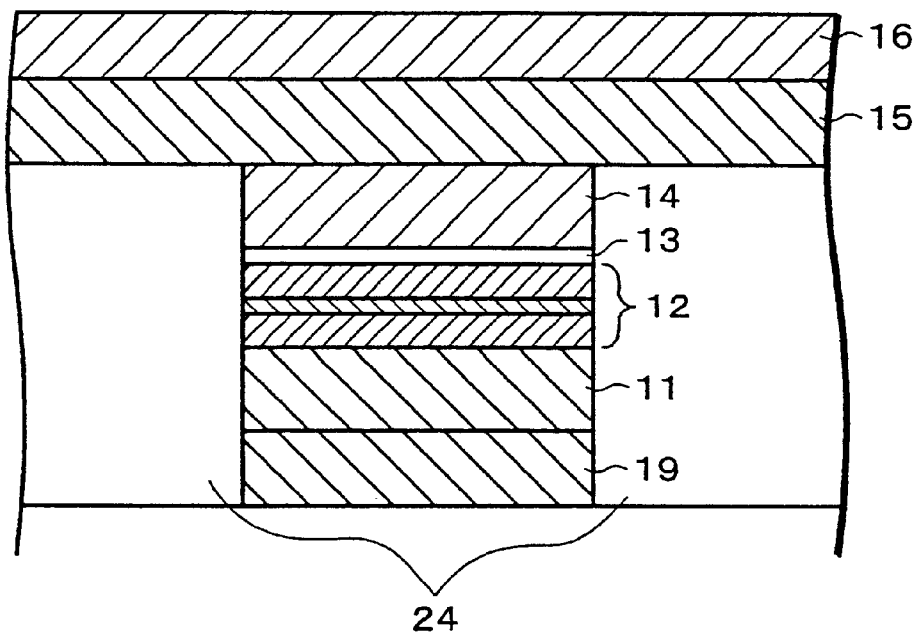
FIGS. 18 (a) and 18(b) are explanatory views showing manufacturing processes of the magnetic memory element according to the present invention.
Figure 18:
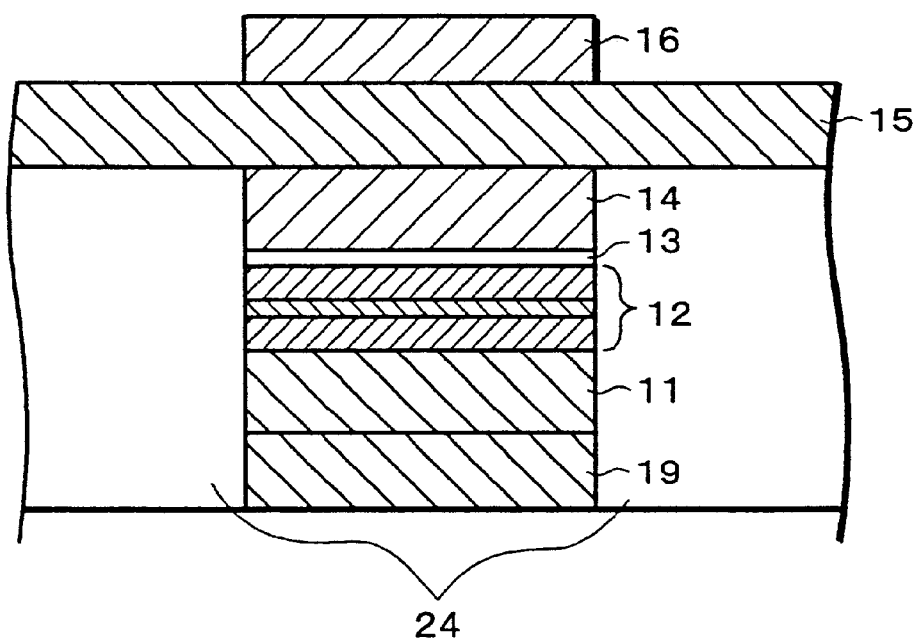

A magnetic memory element 1f according to the present embodiment, as shown in FIG. 14, adopts an MTJ element and includes the conductor layer 18, the insulating layer 17, a conductor layer 19, the antiferromagnetic layer 11, the ferromagnetic layer (fixed layer) 12, the insulating layer 13, the ferromagnetic layer (flexible layer) 14, the conductor layer 15 and the ferromagnetic layer 16.

Next, with reference to FIGS. 16(a), and 16(b) to 20, a first manufacturing method of the magnetic memory of FIG. 14 will be explained. For simplification, one drawing shows a cross section of one magnetic memory element 1f.

Note that, as shown in FIGS. 15(a) and 15(b), the ferromagnetic layers 14 and 16 are individually given a magnetic field $H_B$ generated from the conductor layer 15 and a magnetic field $H_W$ generated from the conductor layer 18, and synthetic magnetic fields of the magnetic fields $H_B$ and $H_W$ acting in opposite directions cancel each other out.

Commonly, a substrate which has the magnetic memory element 1f composing a magnetic memory formed thereon is made up of a semiconductor substrate having a transistor to select the magnetic memory element 1f formed thereon, and an insulating layer which is formed on the semiconductor substrate and made flat. In addition, a word line (conductor layer 18) may be disposed in the vicinity of either a conductor layer 10 as shown in FIG. 14 or the ferromagnetic layer 16 (not shown).

In a first manufacturing step, the conductor layer (lower electrode) 19, the antiferromagnetic layer 11, the ferromagnetic layer 12 (fixed layer), the insulating layer (nonmagnetic layer) 13, and the ferromagnetic layer 14 (flexible layer) are formed sequentially [FIG. 16(a)].

The ferromagnetic layer 12, in the present embodiment, is made up of a pair of ferromagnetic layers which are antiferromagnetically coupled with each other via a metallic layer in-between; however, a single ferromagnetic layer excluding an antiferromagnetic layer may also be adopted instead. In either case, a magnetic memory capable of attaining the same effect by the manufacturing method according to the present embodiment can be manufactured.

Further, in depositing each film of the laminated layers, a common film deposition method such as a sputtering method, a vapor deposition method can be adopted.

In a second manufacturing step, a laminated film which was formed in the first manufacturing step is processed into the shape of a lower electrode. A processing method is such that a resist pattern is formed first by photolithography, then, the film is formed into a desired shape by ion beam etching and the like (not shown). In the following step, the same processing method can also be adopted in the shaping of an element.

In a third manufacturing step, all the layers except the conductor layer 19 are processed so that each magnetic memory element is separated from the others [FIG. 16(b)]. Then, the conductor layer 19 is processed so as to be coupled in the direction of adjacent magnetic memory elements. Up to the present manufacturing step are formed magnetic memory elements each of which is separated from the others via a spacing determined by wiring rules in-between.

In a fourth manufacturing step, without removing a resist 23 which was used as an etching mask in the third manufacturing step, the insulating layer 24 is formed so as to fill spacings among the separated magnetic memory elements [FIG. 17(a)]. The insulating layer 24 may be made of a material such as $SiO_2$ and $Al_2O_3$. By thus depositing the insulating layer 24 without removing the resist 23, the insulating layer 24 deposited onto the magnetic memory elements can be removed by lift off [FIG. 17(b)]. Therefore, a manufacturing step to remove the insulating layer 24 on the magnetic memory elements, such as levelling, is not required.

In a fifth manufacturing step, the second conductor layer 15 and the third ferromagnetic film 16 are formed successively [FIG. 18(a)].

In a sixth manufacturing step, the third ferromagnetic layer 16 is processed into substantially the same shape of the magnetic memory element formed in the third manufacturing step [FIG. 18(b)].

Figure 19:
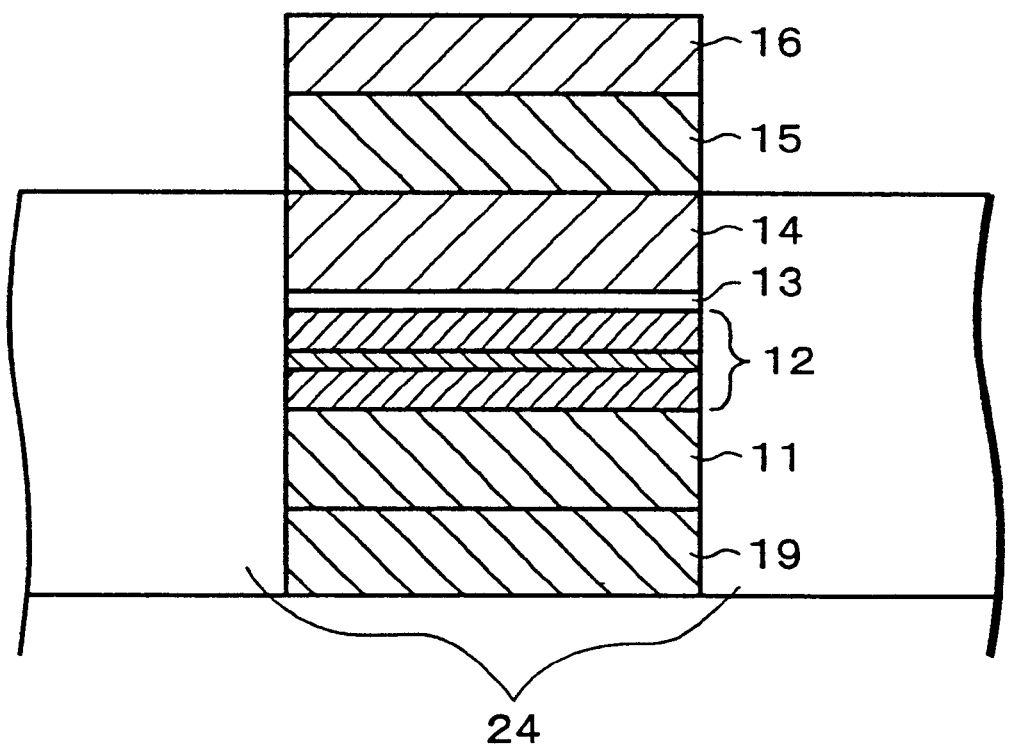
FIG. 19 is an explanatory view showing a manufacturing process of the magnetic memory element according to the present invention.

In a seventh manufacturing step, the second conductor layer 15 is processed so as to be connected only to a direction perpendicular to the direction of magnetization in the ferromagnetic layer 12 (FIG. 19). By thus processing the conductor layer 15 in the end, the insulating layer 24 can be prevented from being etched.

By the foregoing manufacturing method can be obtained the magnetic memory element suitable for a high-density arrangement as shown in FIG. 14, and the magnetic memory.

Further, in the present embodiment, explanation has been made through a manufacturing method in which the conductor layer 18 as being a word line is disposed on the side of the conductor layer 19 (on the side of the substrate), though not limited to this. Namely, by such a manufacturing method as to dispose the conductor layer 18 on the side of the ferromagnetic layer 16, the same effect of the magnetic memory obtained by the manufacturing method of the present embodiment can be attained.

Figure 20:
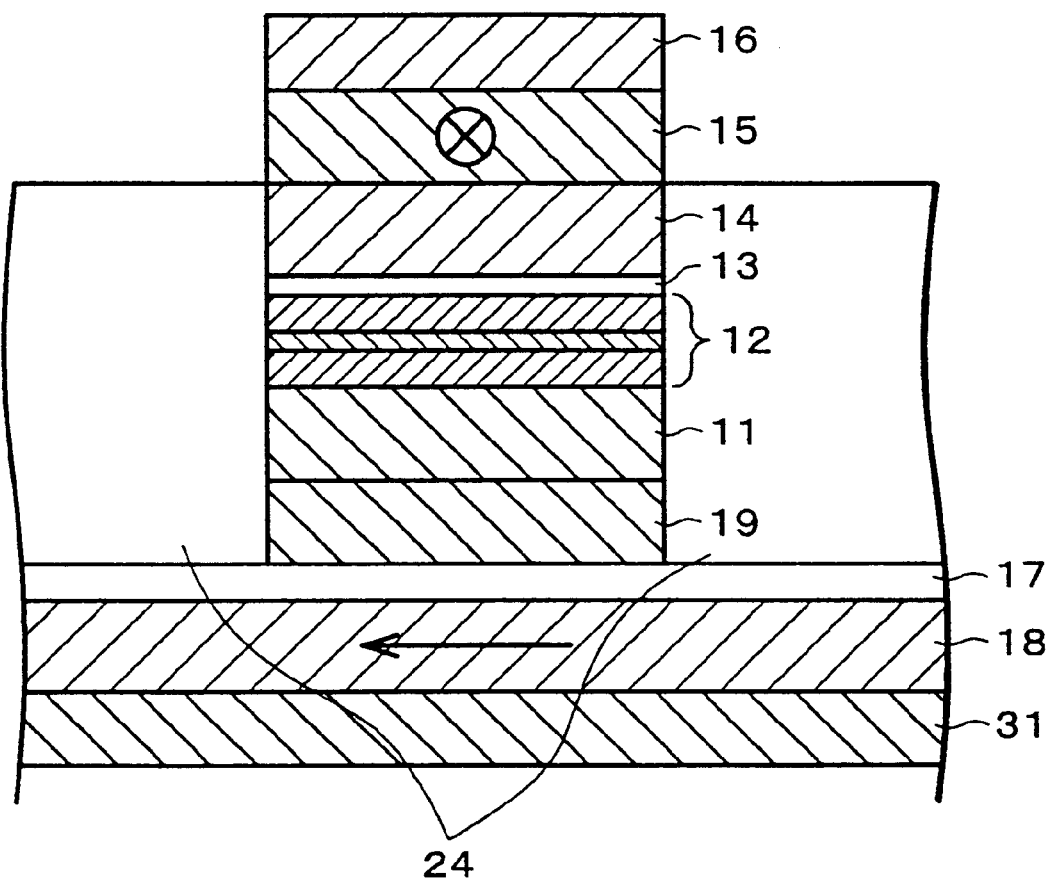
FIG. 20 is a schematic view showing another magnetic memory element manufactured according to the present invention.
Figure 21:
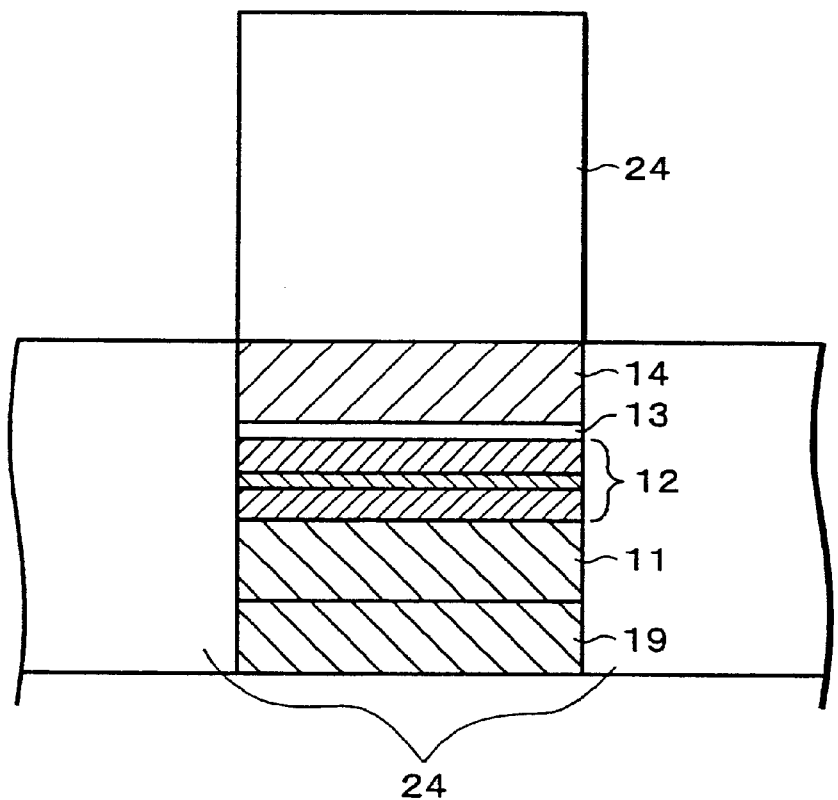
FIGS. 21(a) and 21(b) are explanatory views showing manufacturing processes of a magnetic memory element according to the present invention.
Figure 21:
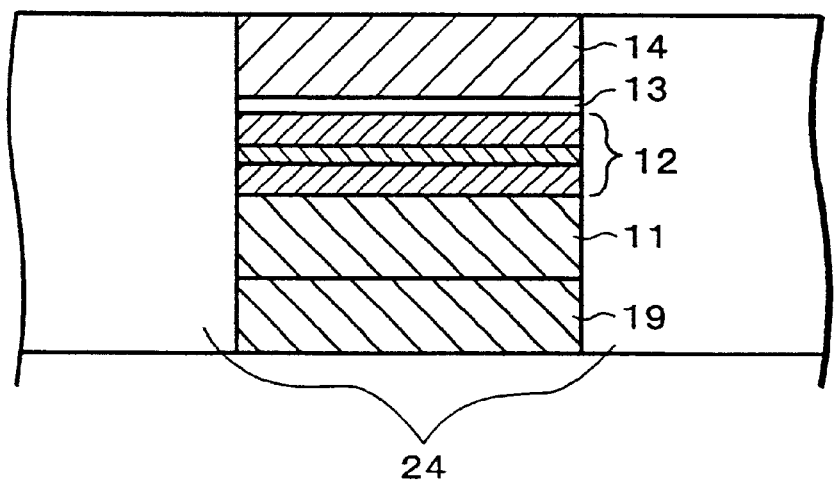

Furthermore, as shown in FIG. 20, there may be manufactured a magnetic memory which has an arrangement in which a ferromagnetic layer 31 having high permeability is disposed adjacent to one side of the conductor layer 18 as being the word line the other side of which facing the insulating layer 17. In this magnetic memory, when recording, a magnetic field is generated by a current flowing through the conductor layer 18; however, since the ferromagnetic layer 31 has high permeability, magnetic fields on one side of the conductor layer 18 closer to the ferromagnetic layer 31 are focused on the ferromagnetic layer 31. As a result, a magnetic field of the other side of the conductor layer 18 closer to the insulating layer 17 becomes large, and therefore, even the same current flow results in the larger magnetic field strength in the positions of the ferromagnetic layer 14 as a storage layer and the ferromagnetic layer 16, compared to the case without the ferromagnetic layer 31, thus reducing power consumption in a magnetic memory compared to the case where ferromagnetic layer 31 is not provided.

The ferromagnetic layer 31 can be made of an alloy having high permeability such as an NiFe alloy, an amorphous alloy of a CoZrNb family and an alloy of an FeAlSi family. Since the ferromagnetic layer 31 can be processed into the same shape of the conductor layer 18, the manufacturing method indicated in the First Embodiment is adoptable in the manufacturing steps thereafter.

As discussed, the magnetic memory according to the present embodiment can be made as the magnetic memory shown in FIG. 20, that is suitable for a high-density arrangement and capable of low power consumption.

Note that, in the fourth manufacturing step of the manufacturing method of the magnetic memory of the present embodiment, as shown in FIGS. 21(a) and 21(b), the resist may be removed while forming the insulating layer 24 so as to fill spacings among the magnetic memory elements each of which is separated from the others [FIG. 21(a)].

Further, in the fifth manufacturing step, the insulating layer 24 on the magnetic memory elements may be removed by mechanical processing such as a CMP so as to perform levelling [FIG. 21(b)].

Alternatively, the insulating layer on the magnetic memory elements may be removed by further levelling irregularities appeared after the formation of the insulating layer with the resist, and performing etch-back entirely. Thereafter, by the same manufacturing steps as above, the magnetic memory as shown in FIG. 14 that is suitable for a high-density arrangement can be obtained.

In either case, it is possible to produce a magnetic memory element and a magnetic memory by the manufacturing method of the present embodiment.

Further, through the foregoing embodiment has been made explanation of a magnetic memory element portion alone; however, other components such as a substrate, a protective layer and an absolute contact layer are obviously necessary in the actual formation of the element.

Further, through the foregoing embodiment has been explained the MTJ element as an example; however, a GMR element is also applicable by insulating a laminated portion of the antiferromagnetic layer 11, ferromagnetic layer 12, insulating layer (non-magnetic layer) 13 and ferromagnetic layer 14, that forms a memory element portion, from a conductor layer.

As discussed, according to the manufacturing method of the magnetic memory element of the present invention, stable magnetization in a storage layer can be attained, while obtaining a magnetic memory element which can reduce an adverse effect over adjacent magnetic memory elements. Consequently, a stable magnetizing state can be maintained even when having a fine pattern, thereby realizing a magnetic memory of higher integration. Moreover, according to the manufacturing method of the magnetic memory of the present invention, a conductor layer can be disposed in the vicinity of a storage layer, and/or magnetic fields generated due to a conductor layer are focused on a storage layer, thereby providing a magnetic memory capable of low power consumption.

Fourth Embodiment

The following will explain another embodiment of the manufacturing method of the magnetic memory according to the present invention with reference to FIGS. 22 through 27(a) and 27(b).

For ease of explanation, members having the same functions as those shown in the drawings pertaining to the First Embodiment above will be given the same reference numerals, and explanation thereof will be omitted here.

Figure 22:
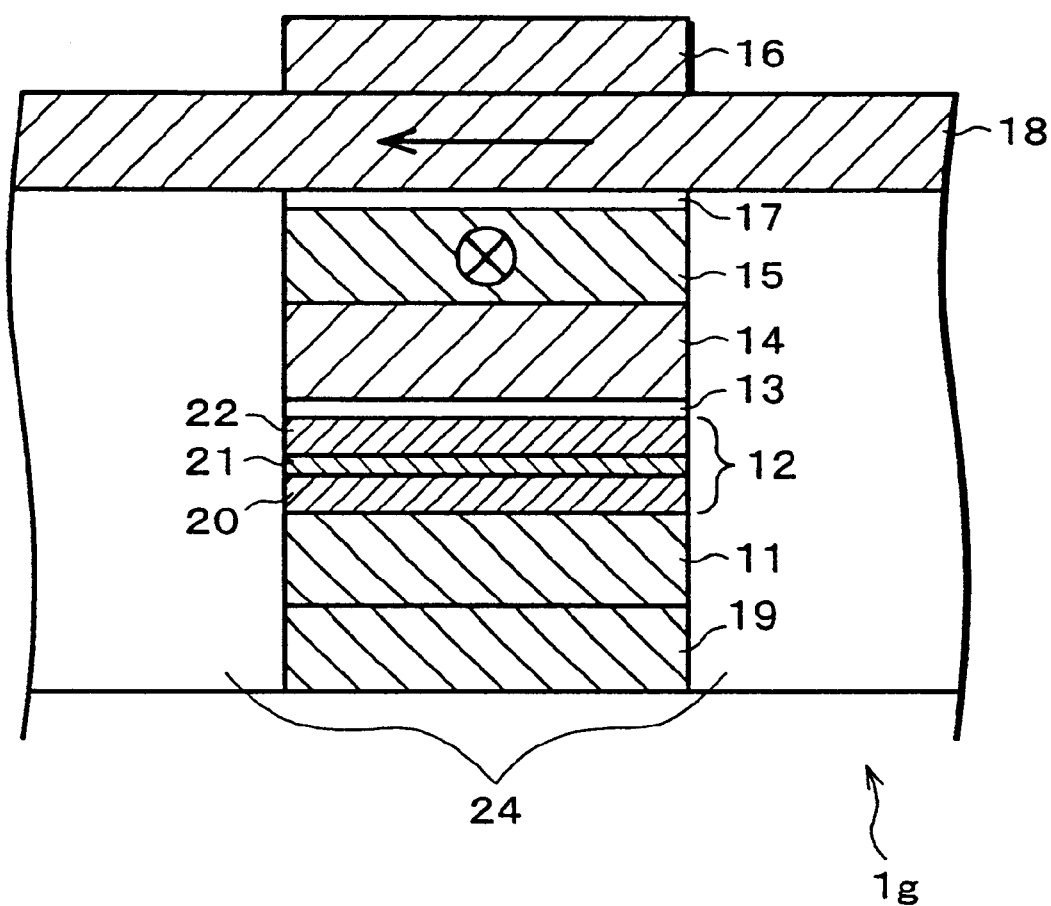
FIG. 22 is an explanatory view showing a magnetic memory element manufactured according to the present invention.
Figure 23:
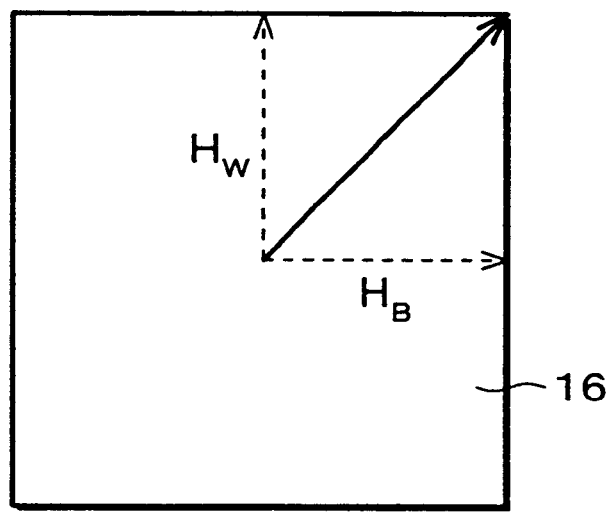
FIGS. 23(a) and 23(b) are plan views showing a magnetic field which is generated in a ferromagnetic layer in a film structure of FIG. 22.
Figure 23:
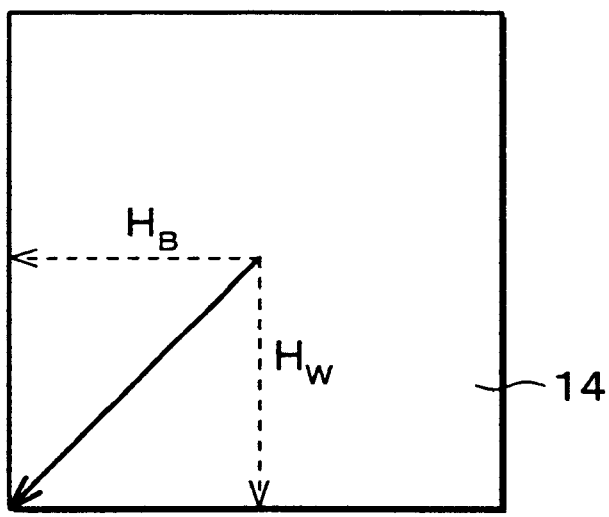
Figure 24:
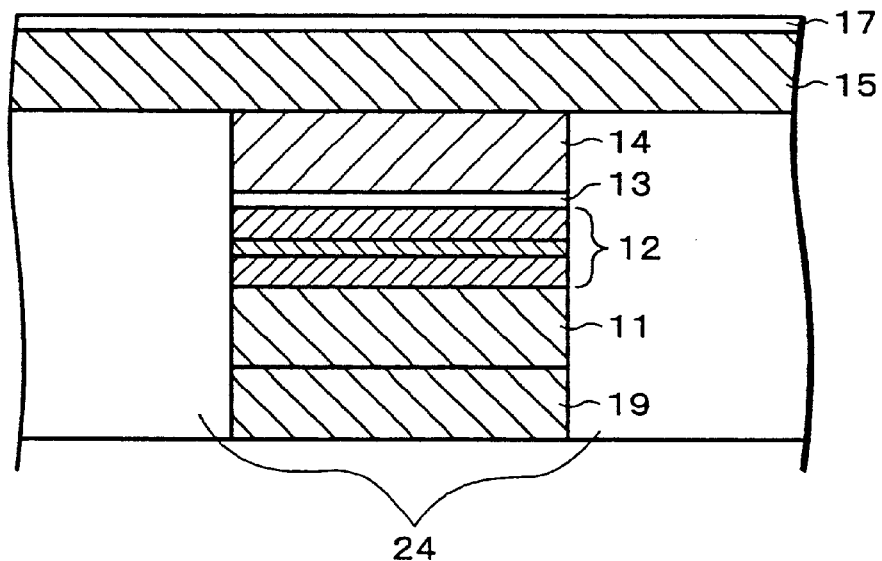
FIGS. 24(a) and 24(b) are explanatory views showing manufacturing processes of a magnetic memory element according to the present invention.
Figure 24:
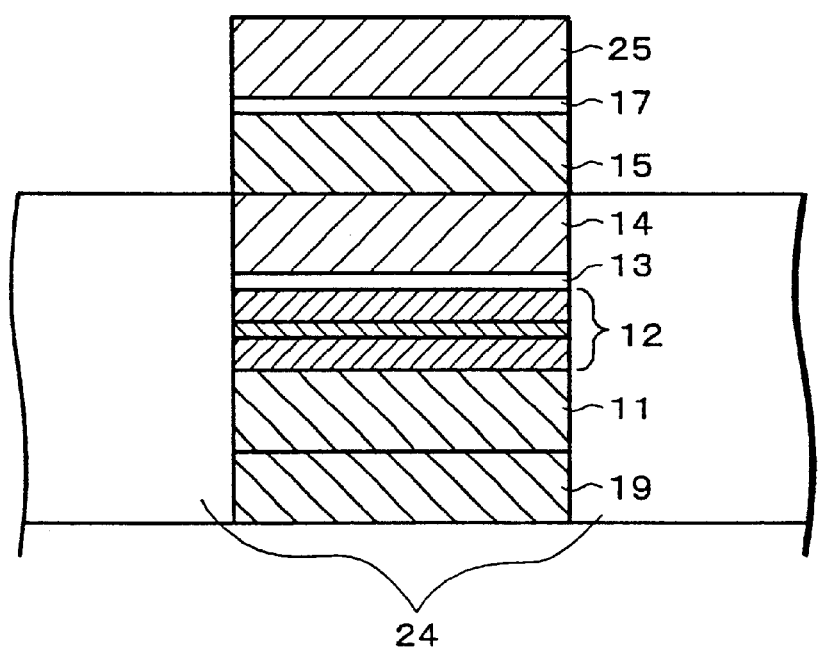
Figure 25:
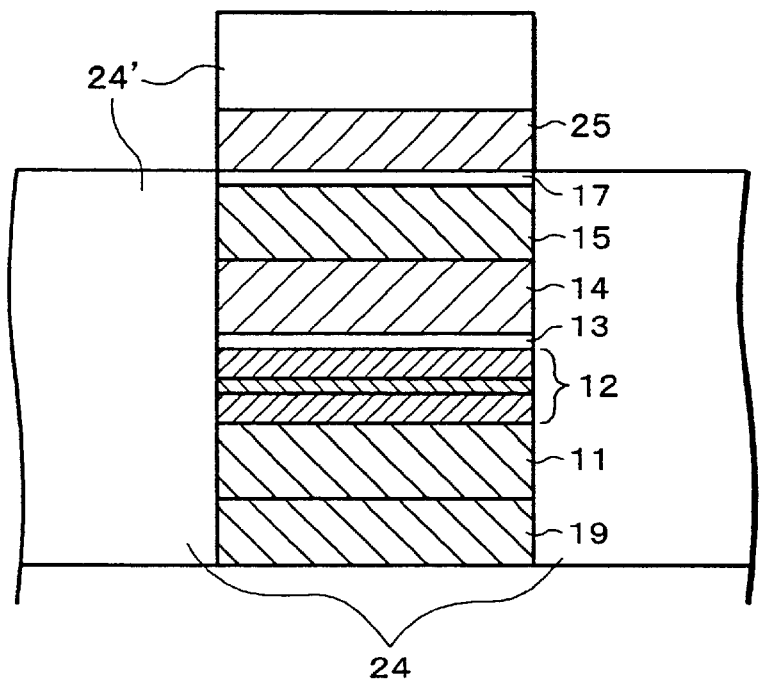
FIGS. 25(a) and 25(b) are explanatory views showing manufacturing processes of a magnetic memory element according to the present invention.
Figure 25:
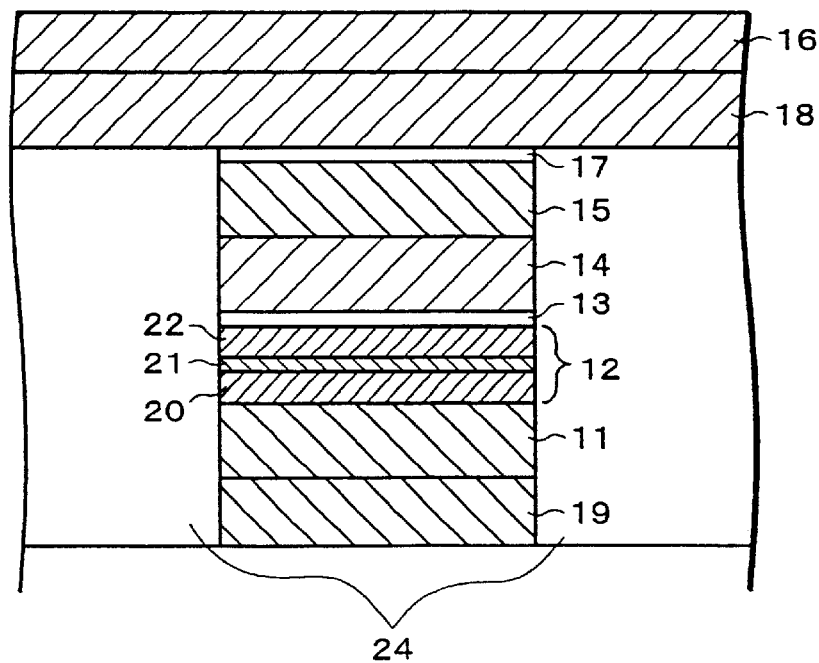

A magnetic memory element 1g according to the present embodiment, as shown in FIG. 22, adopts an MTJ element and includes the conductor layer 19, the antiferromagnetic layer 11, the ferromagnetic layer 12 (fixed layer), the insulating layer 13, the ferromagnetic layer (flexible layer) 14, the conductor layer (bit line) 15, the insulating layer 17, the conductor layer (word line) 18 and the ferromagnetic layer 16.

A magnetic memory which is manufactured by the manufacturing method of the magnetic memory of the present embodiment has an arrangement as with the magnetic memory of the Third Embodiment above, except a difference in the position of the conductor layer 18 that is between the ferromagnetic layers 14 and 16.

In the magnetic memory obtained by the manufacturing method of the present embodiment, the conductor layers 15 and 18 are provided in the vicinity of the ferromagnetic layers 14 and 16, respectively. This arrangement is preferable because, even when currents flowing through the conductor layers 15 and 18 are small, the ferromagnetic layer 14 as the storage layer can obtain sufficient magnetic field strength for recording magnetization information, that realizes low power consumption in the magnetic memory.

Note that, as shown in FIGS. 23(a) and 23(b), the ferromagnetic layers 14 and 16 are individually given a magnetic field $H_B$ generated from the conductor layer 15 and a magnetic field $H_W$ generated from the conductor layer 18, and synthetic magnetic fields of the magnetic fields $H_B$ and $H_W$ acting cancel each other out in opposite directions. Accordingly, in comparison with the case where the ferromagnetic layer 16 is not provided, apparent magnetization in the magnetic memory element 1g can be reduced, thereby preventing an adverse effect between adjacent magnetic memory elements even in a magnetic memory with a high-density arrangement.

Further, since the two conductor layers 15 and 18 allow the ferromagnetic layers 14 and 16 to have the directions of magnetic fields that are substantially anti-parallel to each other, magnetic fields in which the ferromagnetic layers are generated in the process before magnetization is reversed when recording, respectively act in such a direction as to accelerate the reversal of magnetization, thereby greatly reducing storage currents and saving power, compared to a magnetic memory having the two conductor layers 15 and 18 that are not provided between the ferromagnetic layers 14 and 16.

Next, a manufacturing method of the magnetic memory shown in FIG. 22 will be explained with reference to FIGS. 24(a), 24(b) through 26(a) and 26(b). For simplification, each drawing is a cross sectional view of one memory element, showing one side thereof.

Commonly, a substrate on which magnetic memory elements are formed is made up of a semiconductor substrate having a transistor for selecting a magnetic memory element which performs reproducing and recording formed thereon, and an insulating layer which is formed on the semiconductor substrate and made flat (not shown).

First to Fourth manufacturing steps are the same as those of the Third Embodiment above.

In a fifth manufacturing step, the conductor layer 15 and the insulating layer 17 are formed successively [FIG. 24(a)].

In a sixth manufacturing step, a resist pattern is formed on the conductor layer 15 and the insulating layer 17 which are then processed so as to be connected to magnetic memory elements adjacently provided in a direction perpendicular to the direction of magnetization in the ferromagnetic layer 12 [FIG. 24(b)].

In a seventh manufacturing step, without removing a resist 25 which was used as an etching mask in the sixth manufacturing step, an insulating layer 24' is formed so as to fill spacings between wires formed [FIG. 25(a)]. By thus depositing the insulating layer 24' without removing the resist 25, the insulating layer 24' deposited on the magnetic memory elements can be removed by lift-off.

In an eighth manufacturing step, the conductor layer 18 and the ferromagnetic layer 16 are formed successively [FIG. 25(b)].

Figure 26:
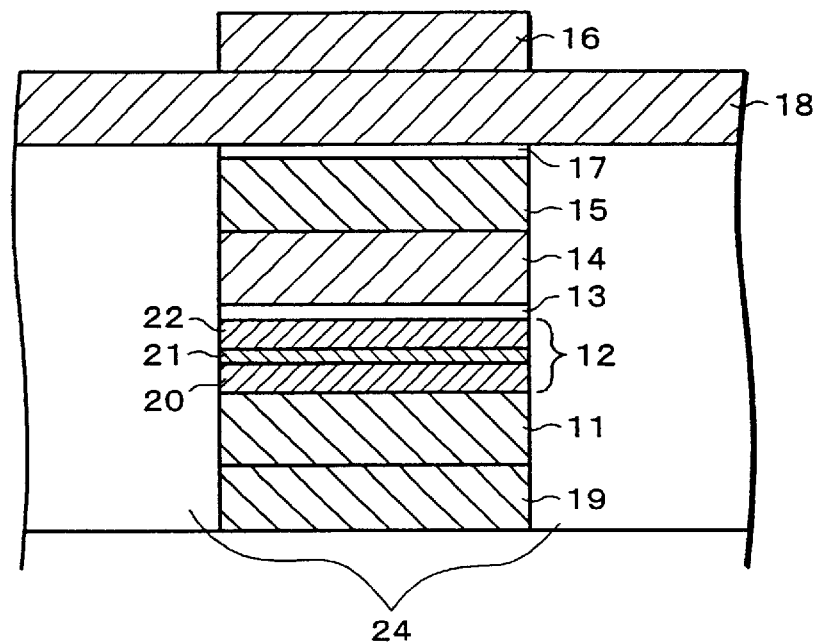
FIGS. 26(a) and 26(b) are explanatory views showing manufacturing processes of a magnetic memory element according to the present invention.
Figure 26:
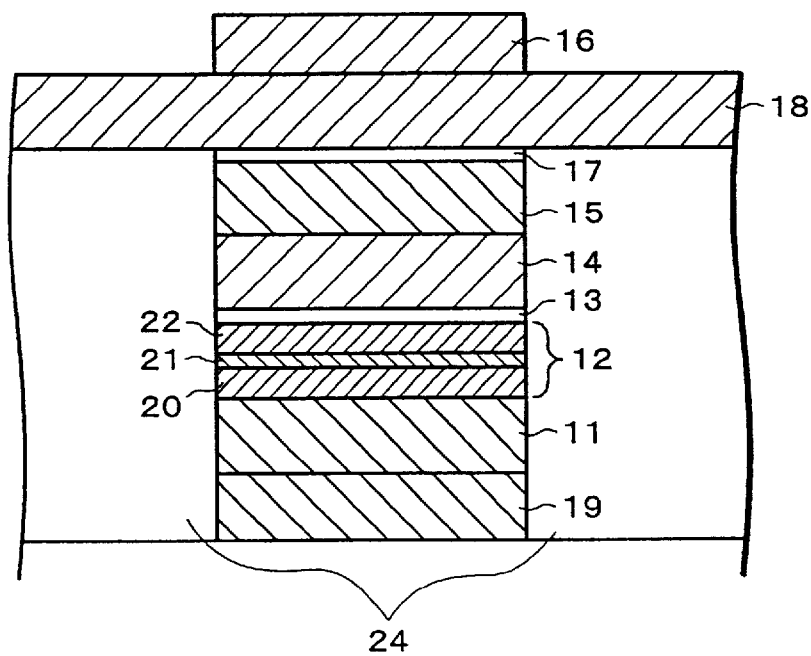

In a ninth manufacturing step, the ferromagnetic layer 16 is processed into substantially the same shape of the magnetic element formed in the third manufacturing step [FIG. 26 (a)].

In a tenth manufacturing step, the conductor layer 18 is processed so as to be connected only to magnetic memory elements adjacent in a direction in parallel with the direction of magnetization in the ferromagnetic layer 12 [FIG. 26(b)]. By thus processing the conductor layer 18 in the end, the insulating layer 24 can be prevented from being etched.

By the foregoing manufacturing method can be obtained the magnetic memory element suitable for a high-density arrangement, and the magnetic memory as shown in FIG. 22.

Figure 27:
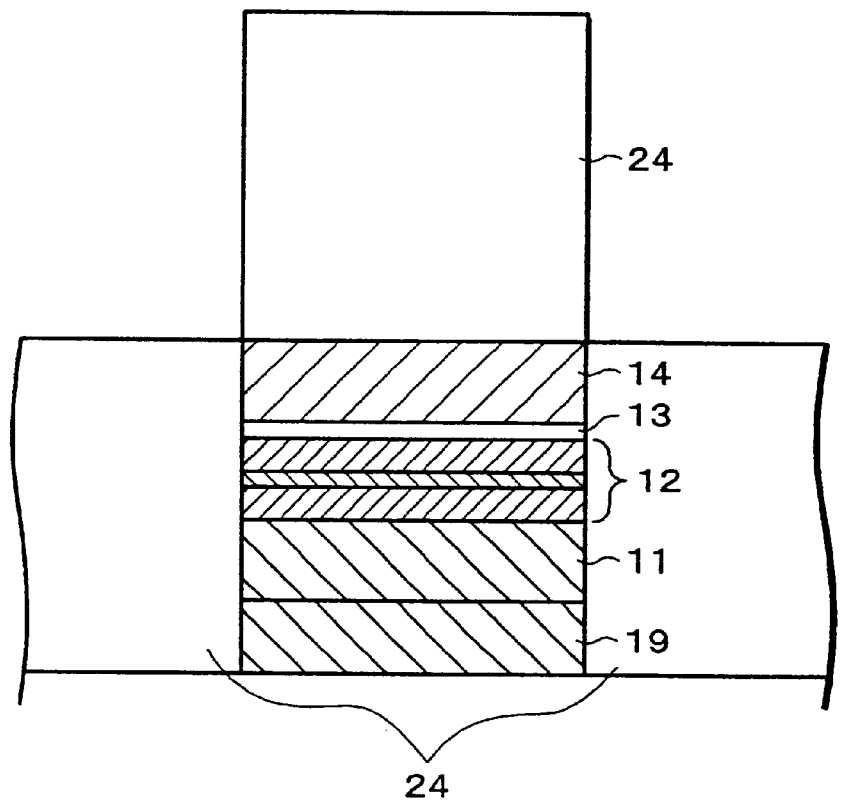
FIGS. 27(a) and 27(b) are explanatory views showing manufacturing processes of a magnetic memory element according to the present invention.
Figure 27:
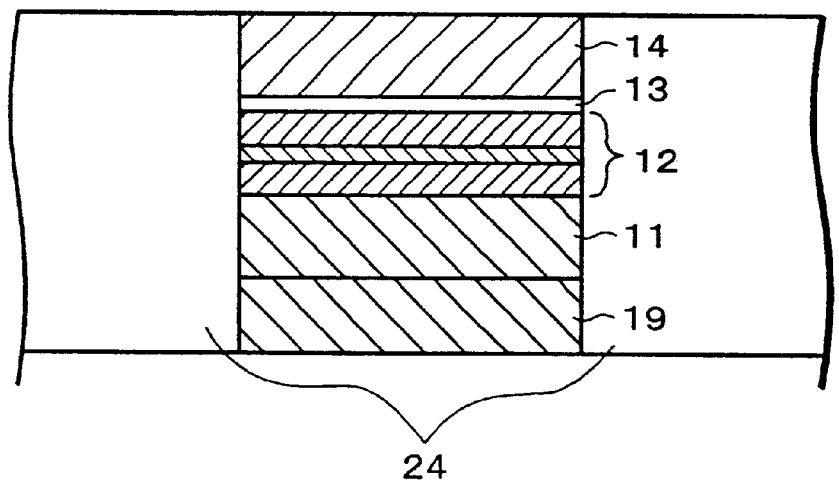
Figure 28:
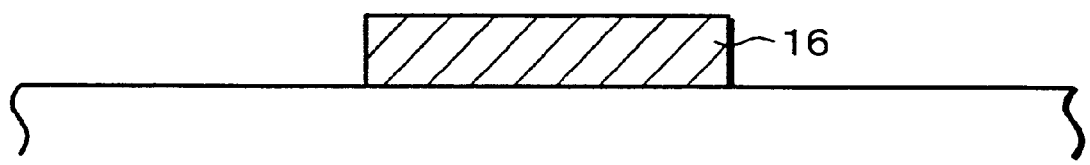
FIGS. 28(a) and 28(b) are explanatory views showing manufacturing processes of a manufacturing method of the magnetic memory element of FIG. 11.
Figure 28:
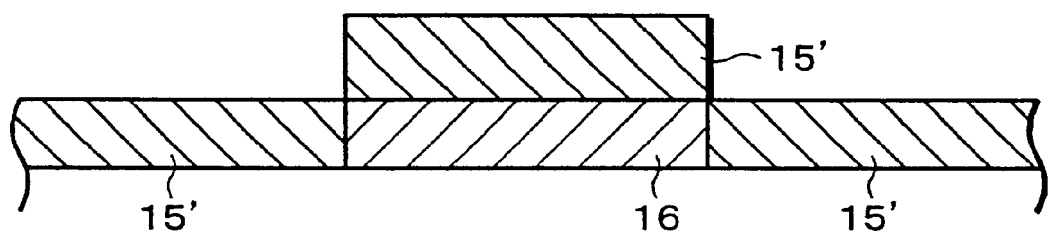
Figure 29:
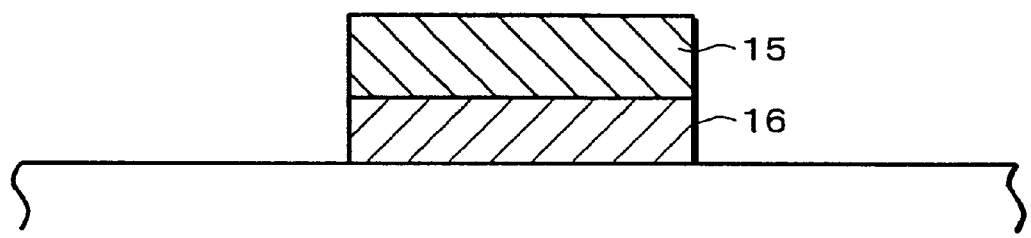
FIGS. 29(a) and 29(b) are explanatory views showing manufacturing processes of a manufacturing method of the magnetic memory element of FIG. 11.
Figure 29:
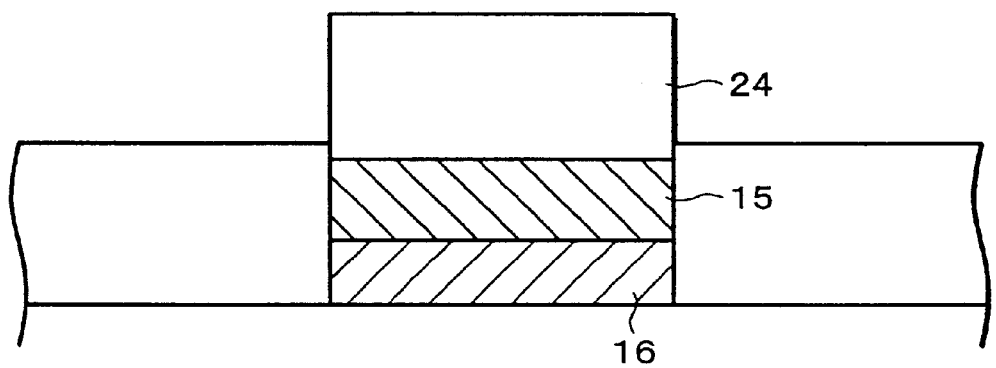
Figure 30:
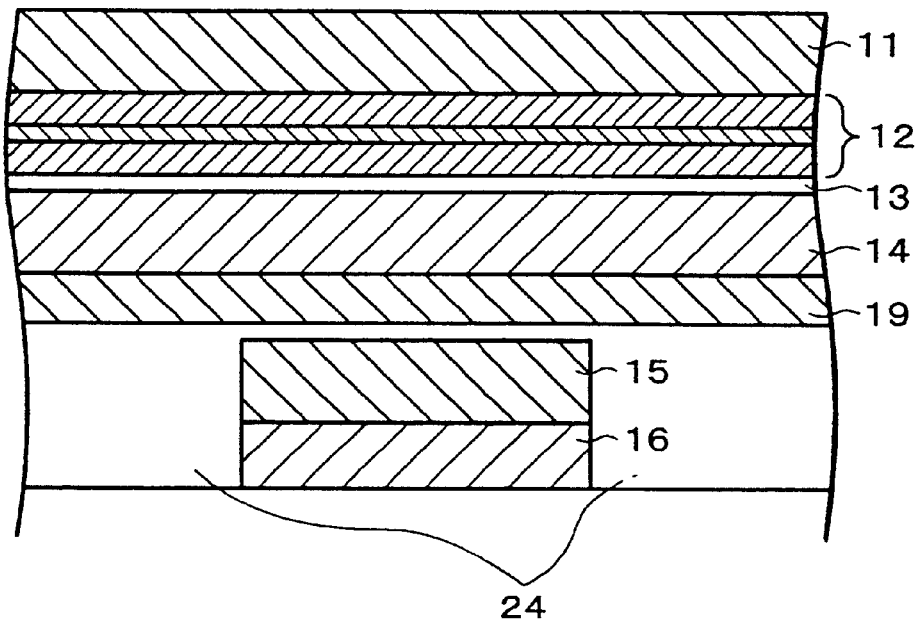
FIGS. 30(a) and 30(b) are explanatory views showing manufacturing processes of a manufacturing method of the magnetic memory element of FIG. 11.
Figure 30:
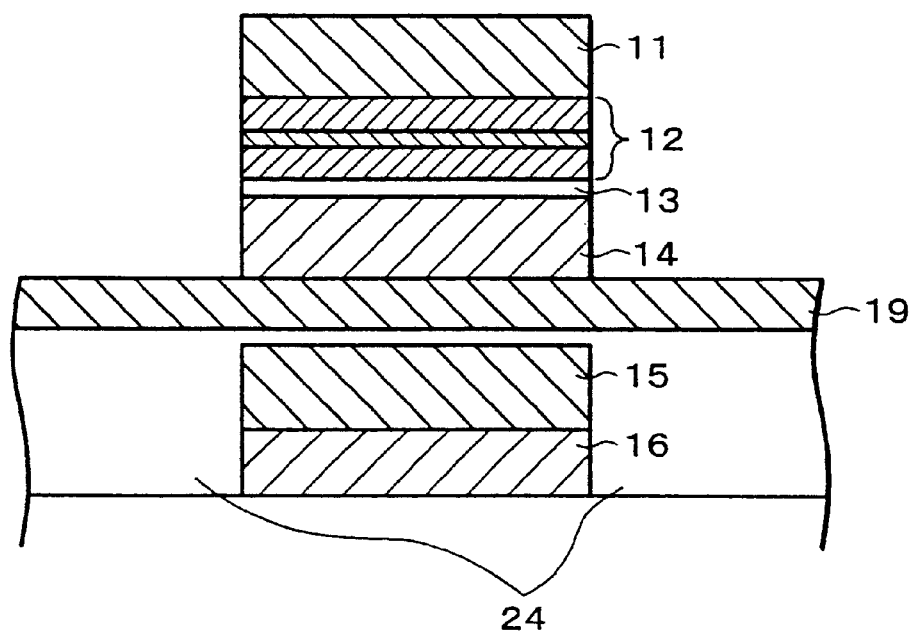
Figure 31:
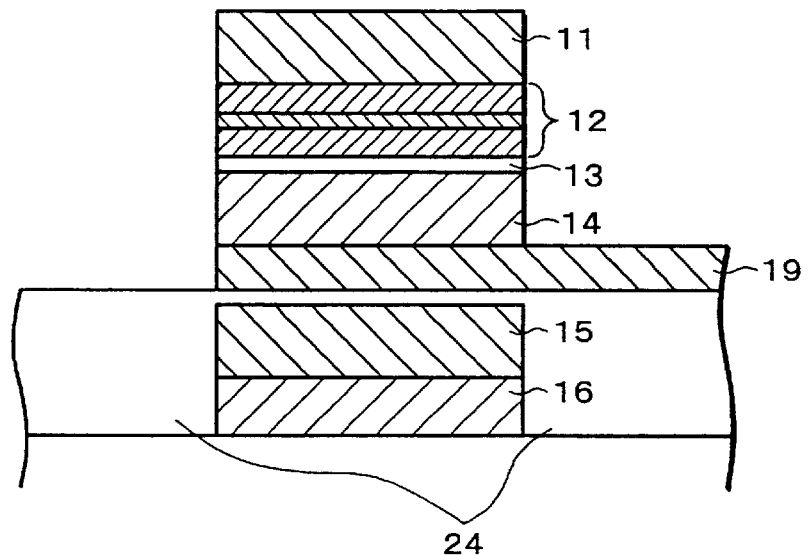
FIGS. 31(a) and 31(b) are explanatory views showing manufacturing processes of a manufacturing method of the magnetic memory element of FIG. 11.
Figure 31:
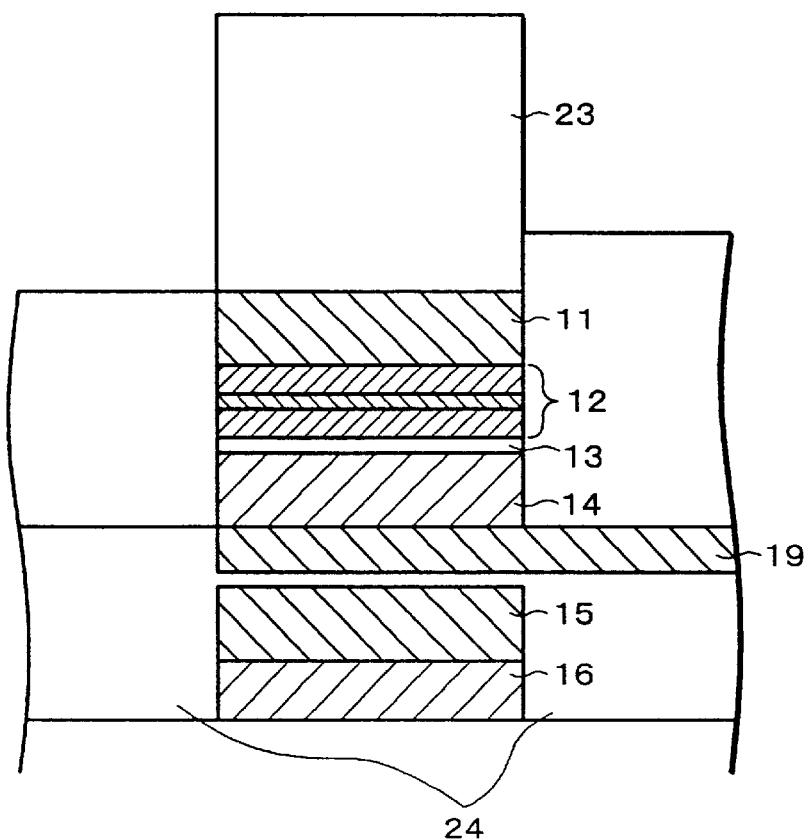

Next, the following will explain another manufacturing method of the magnetic memory shown in FIG. 22 with reference to FIG. 27.

Up to a third manufacturing step in which a magnetic memory element is separated from the others, this manufacturing method is the same as that of the First Embodiment.

In a fourth manufacturing step, the resist is removed, and the insulating layer 24 is formed so as to fill spacings among the separated magnetic memory elements [FIG. 27(a)].

In a fifth manufacturing step, the insulating layer 24 is removed by mechanical processing such as a CMP, so as to perform levelling [FIG. 27(b)]. Alternatively, the insulating layer on the magnetic memory elements can be removed by further levelling irregularities appeared after the formation of the insulating layer with the resist, and performing etch-back entirely.

Thereafter, by the same manufacturing method as that of the magnetic memory in the present embodiment, the magnetic memory as shown in FIG. 22 that is suitable for a high-density arrangement can be obtained.

Further, in this manufacturing method were successively formed the conductor layer 15 and the insulating layer 17; however, alternatively, only the conductor layer 15 may be formed first, then, after performing processing and levelling thereon, the insulating layer 17, the conductor layer 18 and the ferromagnetic layer 16 are formed successively.

As for the arrangement of the magnetic memory, the magnetization in the ferromagnetic layer (fixed layer) 12 is fixed by exchange coupling with the antiferromagnetic layer 11. However, it is also possible to adopt other means such as using a ferromagnetic material having a larger coercive force for the ferromagnetic layer 12 as the fixed layer. Further, the ferromagnetic layer 12 may also be composed of, for example, a ferrimagnetic material such as a rare earth—transition metal alloy film of a composition near a compensation point, so as to reduce an influence of magnetic poles on an edge of the ferromagnetic layer.

Furthermore, it is preferable to set the coercive force in the ferromagnetic layer 16 to be smaller than that in the ferromagnetic layer 14, thereby reversing magnetization in the ferromagnetic layer 16 first when recording. Accordingly, since magnetic poles generated on both ends of the ferromagnetic layer 16 generate magnetic fields in such a direction as to accelerate the reversal of the direction of magnetization in the ferromagnetic layer as the storage layer, magnetization is likely to be reversed, and even when a current flowing through a conductor layer is small, a magnetization which is sufficient for recording can be generated, thereby greatly saving power in a magnetic memory.

In either case, a magnetic memory element and a magnetic memory can be manufactured by the manufacturing method according to the present invention.

Further, through the foregoing embodiment has been made explanation of the magnetic memory element portion alone; however, other components such as a substrate, a protective layer and an absolute contact layer are obviously necessary in the actual formation of the element.

Further, in the foregoing embodiment has been explained the MTJ element as an example; however, a GMR element is also applicable by insulating a laminated portion of the antiferromagnetic layer 11, ferromagnetic layer 12, insulating layer (non-magnetic layer) 13 and ferromagnetic layer 14, that forms a memory element portion, from a conductor layer.

As discussed, according to the manufacturing method of the magnetic memory of the present embodiment, stable magnetization in the storage layer can be realized while reducing apparent magnetization in the magnetic memory element, thereby obtaining a magnetic memory element capable of reducing an adverse effect over adjacent magnetic memory elements. Accordingly, a stable magnetizing state can be maintained even when having a fine pattern, thereby realizing a magnetic memory having higher integration. Moreover, since the conductor layer which provide the storage layer with magnetization information is provided in the vicinity of the ferromagnetic layer to be the storage layer, and/or magnetization in the storage layer is rotated with ease, a magnetic memory capable of low power consumption can be provided.

Fifth Embodiment

The following will explain one embodiment of the manufacturing method of the magnetic memory as explained in the Second Embodiment of the present invention with reference to FIGS. 28(a), and 28(b) through 32.

For ease of explanation, members having the same functions as those shown in the drawings pertaining to the First to Fourth embodiments above will be given the same reference numerals, and explanation thereof will be omitted here.

Commonly, a substrate on which the magnetic memory element 1e is formed is made up of a semiconductor substrate having a transistor for selecting a magnetic memory element which performs reproducing and recording formed thereon, and an insulating layer which is formed on the semiconductor substrate and made flat. The following will describe the manufacturing steps to form the magnetic memory element 1e on this insulating layer.

In a first manufacturing step, a ferromagnetic layer having uniaxial anisotropic in-plane magnetization is formed all over the insulating layer by the sputtering method.

In a second manufacturing step, as shown in FIG. 28(a), a resist pattern is formed by photolithography, then, the ferromagnetic layer is processed into a desired shape by ion beam etching and the like. In the present manufacturing step, an array of ferromagnetic substances having the shape of the separated magnetic memory element is formed, thereby forming the ferromagnetic layer 16.

In a third manufacturing step, as shown in FIG. 28(b), a conductor layer 15' is formed all over the substrate having the ferromagnetic layer 16 formed thereon.

In a fourth manufacturing step, a resist pattern is formed on the conductor layer 15', then, as shown in FIG. 29(a), the conductor layer 15' is processed so that the magnetic memory elements are adjacently provided in a direction perpendicular to the direction of magnetization in the ferromagnetic layer 16, via the conductor layer 15' in-between, thereby forming the conductor layer 15.

In a fifth manufacturing step, as shown in FIG. 29(b), the insulating layer 24 is formed so as to cover an surface of the conductor layer 15 and fill spacings between adjacent magnetic memory elements.

In a sixth manufacturing step, as shown in FIG. 30(a), after levelling the insulating layer 24 on the conductor layer 15 so as to have a constant film thickness is formed a laminated film of the conductor layer 19, the ferromagnetic layer 14, the insulating layer 13, the ferromagnetic layer 12 and the antiferromagnetic layer 11 in this order from the side of the substrate. It should be noted that a conductor layer to which a drain electrode of the transistor and the conductor layer 19 are electrically connected requires to be formed separately before forming the conductor layer 19. The ferromagnetic layer 16 and the conductor layer 15 are used therefor by forming them into a desired pattern.

In a seventh manufacturing step, as shown in FIG. 30(b), a resist pattern is formed on the antiferromagnetic layer 11, then, the resist pattern is processed into substantially the same shape of the ferromagnetic layer 16, thereby forming a plurality of magnetic memory elements each of which is separated from the others.

In an eighth manufacturing step, as shown in FIG. 31(a), a resist pattern is formed on the conductor layer 19 (lower electrode), and the conductor layer 19 is processed into the shape of a lower electrode.

In a ninth manufacturing step, as shown in FIG. 31(b), an insulating layer 23 is formed so as to fill spacings among the plurality of separated magnetic memory elements.

Figure 32:
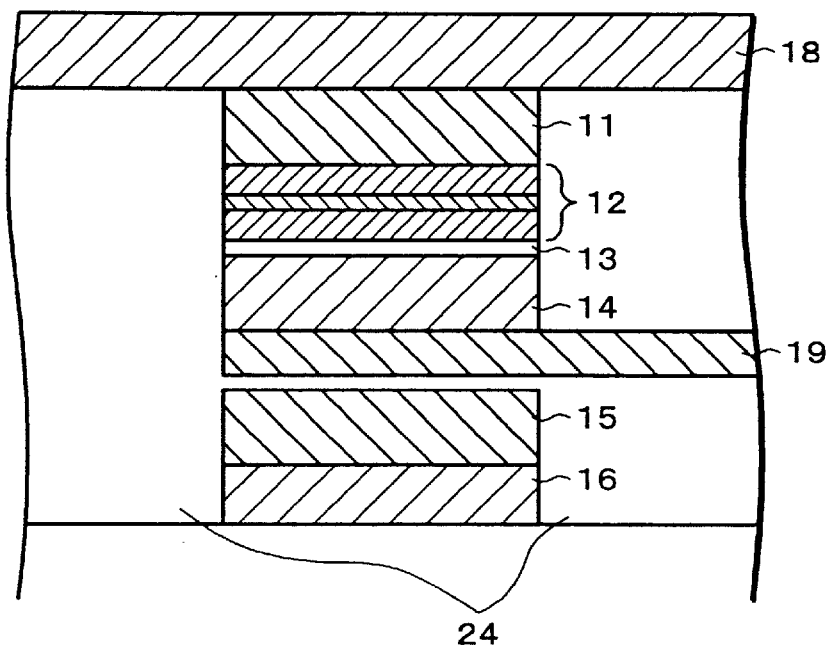
FIG. 32 is an explanatory view showing a manufacturing process of a manufacturing method of the magnetic memory element of FIG. 11.
Figure 33:
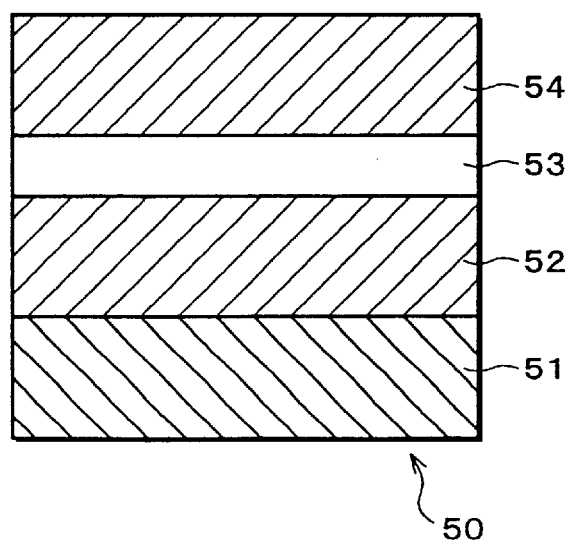
FIG. 33 is a cross sectional view showing a structure of a conventional MTJ element.
Figure 34:
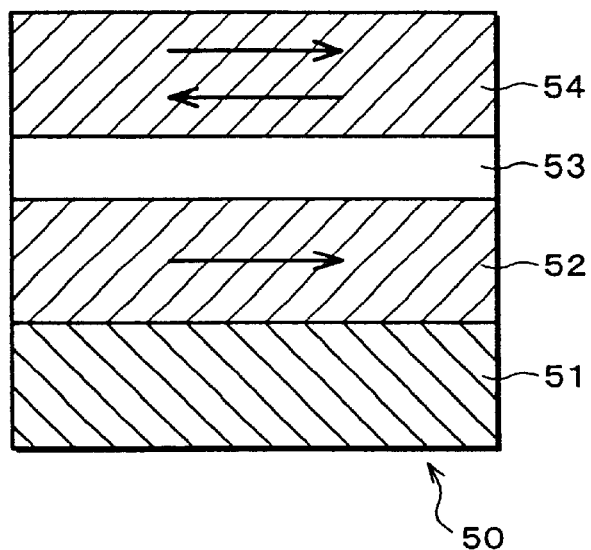
FIG. 34 is a cross sectional view showing the principles of the conventional MTJ element.
Figure 35:
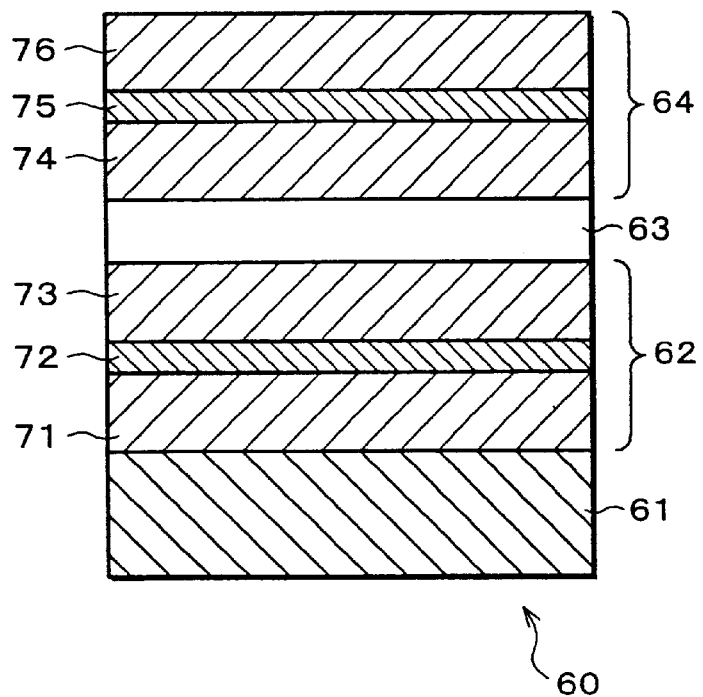
FIG. 35 is a cross sectional view showing a structure of another conventional MTJ element.

In a tenth manufacturing step, after levelling the insulating layer 23 by a CMP (Chemical-Mechanical Polish), as shown in FIG. 32, the conductor layer 18 is formed on the insulating layer 24 on and between the plurality of magnetic memory elements.

In an eleventh manufacturing step, the conductor layer 18 is processed so that the adjacent magnetic memory elements are coupled only in a direction orthogonally intersecting the conductor layer 15, thereby manufacturing a magnetic memory.

As described, the magnetic memory that is obtained by the foregoing manufacturing method supplies a current to the bit line 15 formed in the fourth manufacturing step, so as to provide the ferromagnetic layers 16 and 14 with magnetization of the opposite directions. In addition, the ferromagnetic layers 12, 14 and 16 have uniaxial anisotropic in-plane magnetization. The conductor layer 15 supplies a current perpendicularly to the direction of the uniaxial anisotropic in-plane magnetization. Consequently, the direction of magnetic field according to the conductor layer 15 is equal to the direction of in-plane magnetization in the ferromagnetic layers 12, 14 and 16. Further, the ferromagnetic layers 16 and 14 that are provided over and under the conductor layer 15, respectively, are given magnetic fields of opposite directions. Hence, in-plane magnetization in the ferromagnetic layer 16 and that in the ferromagnetic layer 14 become anti-parallel to each other and therefore balanced.

Further, the ferromagnetic layer 12 has a triple layer structure of ferromagnetic layer/metallic layer/ferromagnetic layer. Since the pair of ferromagnetic layers 20 and 22 are antiferromagnetically coupled with each other, magnetization is in a balanced state within the ferromagnetic layer 12.

Accordingly, as discussed, a higher-density arrangement can be realized, thereby obtaining a magnetic memory capable of small power consumption.

Note that, in the first manufacturing step, the ferromagnetic layer 16 may be formed by not only the sputtering method but also other common deposition methods such as a vapor deposition method.

Further, as a levelling method for the insulating layer 24, for example, mechanical processing such as the CMP may be adopted. Alternatively, the insulating layer 24 may be removed by levelling irregularities appeared after forming the insulating layer 24 with resist and performing etch-back thereon entirely. Alternatively, it is also possible that, without removing the resist that was used as an etching mask in the fourth manufacturing step, the insulating layer 24 is formed so as to fill a spacing around the conductor layer 15, then, after removing the insulating layer 24 on the conductor layer 15 by lift-off and levelling thereon, films of an upper part of lamination than the insulating layer and the conductor layer 15 are successively formed.

In the present embodiment, for ease of explanation, a single magnetic memory element portion has been explained; however, other components such as a substrate, a protective layer and an absolute contact layer are necessary in the actual formation of the element.

As materials for the first, second and third ferromagnetic layers 12, 14 and 16 may be used Fe, Co and Ni, or alloys thereof.

In addition, as materials for the antiferromagnetic layer 11 may be used alloys such as FeMn, NiMn, PtMn and IrMn.

Further, the insulating layer 13 is preferably made of an $Al_2O_3$ film in view of an MR ratio; however, an insulating film of another oxide film or nitride film, or an insulating film such as an Si film, a diamond film and a diamond-like carbon (DLC) film may also be adopted.

In addition, it is preferable that the first, second and third ferromagnetic layers 12, 14 and 16 respectively have a film thickness of not less than 10 Å. By setting this range, a ferromagnetic substance can be prevented from becoming a super paramagnetic substance under the effect of thermal energy.

Further, it is preferable to form the insulating layer 13 to have a film thickness of not less than 3 Å and not more than 30 Å. When forming the insulating film 13 to have a film thickness of less than 3 Å, the second and third ferromagnetic layers 14 and 16 are closely disposed, so that they may possibly be short-circuited electrically. On the other hand, when forming the insulating layer 13 to have a film thickness of more than 30 Å, an electron is substantially free from a tunnel effect between the second and third ferromagnetic layers 14 and 16, thereby reducing a ratio of magnetic reluctance.

Further, the first ferromagnetic layer 12 may be made of a single ferromagnetic substance, but having the triple-layer structure as with the present embodiment can reduce magnetic poles generated on an edge of the first ferromagnetic layer 12 to virtually zero.

Further, in the present embodiment, magnetization in the first ferromagnetic layer (fixed layer) is fixed by exchange coupling with the antiferromagnetic layer 11. However, by adopting other means for composing the first ferromagnetic layer 12 of a ferromagnetic material having a large coercive force, the antiferromagnetic layer 11 may be omitted. For example, when composing the first ferromagnetic layer 12 of a ferrimagnetic material such as a rare earth—transition metal alloy film of a composition near a compensation point, generation of magnetic poles on the edge of the ferromagnetic layer is prevented, thereby preventing an adverse effect over adjacent magnetic memories.

Further, by adopting a material having a large anisotropic magnetic field to compose the ferromagnetic layers 20 and 22, the antiferromagnetic layer 11 can be omitted.

Further, as an arrangement of the magnetic memory element, by setting a coercive force in the third ferromagnetic layer 16 to be smaller than a coercive force in the second ferromagnetic layer 14, it is possible to reverse magnetization in the third ferromagnetic layer 16 first when recording. Consequently, magnetic poles generated on both ends of the first ferromagnetic layer 12 causes generation of a magnetic field in such a direction as to accelerate the reversal of magnetization in the second ferromagnetic layer 14. This results in easier reversal of magnetization when recording, thereby reducing a current which is necessary for recording, and power consumption.

Further, in the present embodiment has been explained the magnetic memory as the MTJ element as an example; however, a GMR element is also applicable by insulating a laminated portion of the antiferromagnetic layer 11, the first ferromagnetic layer 12, the second ferromagnetic layer 14 and the third ferromagnetic layer 16 in the memory element 1 from a conductor layer.

Note that, a manufacturing method according to the present invention which is a manufacturing method of a magnetic memory having a plurality of magnetic memory elements each including a first ferromagnetic layer, a non-magnetic layer and a second ferromagnetic layer to be a storage layer, which are laminated, the method may include at least the steps of: forming a third ferromagnetic layer on a substrate; processing the third ferromagnetic layer into the shape of a magnetic memory element which is separated from the others; forming a first conductor layer on the substrate; processing the first conductor layer so that the adjacent third ferromagnetic layers separated are coupled with each other only in one direction; forming an insulating layer on the substrate so as to fill a spacing around the processed first conductor layers; forming a laminated film of a second conductor layer, the first ferromagnetic layer, the non-magnetic layer and the second ferromagnetic layer which are successively formed in this order from the side of the substrate; forming a plurality of separated magnetic memory elements by processing the laminated film of the first ferromagnetic layer, the non-magnetic layer and the second ferromagnetic layer, other than the second conductor layer, into substantially the same shape of the third ferromagnetic layer; processing the second conductor layer into the shape of a lower electrode; forming an insulating layer so as to fill spacings among the plurality of magnetic memory elements; forming a third conductor layer on the insulating layer on and between the plurality of magnetic memory elements; and processing the third conductor layer so that the adjacent separated magnetic memory elements only in a direction orthogonally intersecting the first conductor layer.

Further, it is positively preferable that the second ferromagnetic layer to be the storage layer which stores magnetization information, the insulating layer, the first ferromagnetic layer and the antiferromagnetic layer which is exchange-coupled with the first ferromagnetic layer are laminated so as to form a storage portion.

With this arrangement, the first ferromagnetic layer becomes a fixed layer having fixed magnetization therein, due to the exchange-coupling with the antiferromagnetic layer. There can be provided a magnetic memory which utilizes a magneto-resistive effect such that electrical resistance varies in accordance with a difference in a direction of magnetization between the first ferromagnetic layer to be the fixed layer and the second ferromagnetic layer to be the storage layer.

Further, it is positively preferable to form the first ferromagnetic layer so as to have a triple-layer structure in which a pair of ferromagnetic layers which are antiferromagnetically coupled with each other sandwich a metallic layer.

With this arrangement, since the pair of ferromagnetic layers composing the ferromagnetic layer are antiferromagnetically coupled with each other, apparent magnetization in the first ferromagnetic layer can be reduced to 0, thereby greatly suppressing generation of magnetic poles on an edge portion compared to the case where the first ferromagnetic layer is formed to have a single layer, and more surely reducing apparent magnetization in every magnetic memory element to 0. As a result, even when magnetic memory elements which compose a magnetic memory are closely disposed, a stable magnetizing state can be maintained in the storage layer, thereby providing a magnetic memory having a higher-density arrangement.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A magnetic memory element, comprising lamination of at least a first ferromagnetic layer, a non-magnetic layer and a second ferromagnetic layer, wherein a third ferromagnetic layer is provided via at least one conductor layer in-between, on one side of said second ferromagnetic layer the other side of which is closer to the non-magnetic layer.

2. The magnetic memory element as set forth in claim 1, wherein a magnitude of magnetization in the third ferromagnetic layer is substantially the same as a magnitude of magnetization in said second ferromagnetic layer adjacent to said conductor layer.

3. The magnetic memory element as set forth in claim 1, wherein said third ferromagnetic layer has a coercive force which is smaller than a coercive force in said second ferromagnetic layer adjacent to said conductor layer.

4. The magnetic memory element as set forth in claim 1, wherein a second conductor layer is provided between said conductor layer and third ferromagnetic layer.

5. The magnetic memory element as set forth in claim 1, wherein:
   a second conductor layer is provided outside the first or third ferromagnetic layer, and
   a ferromagnetic layer is adjacently provided on one side of said second conductor layer the other side of which facing said first or third ferromagnetic layer.

6. The magnetic memory element as set forth in claim 1, wherein said non-magnetic layer between said first and second ferromagnetic layers is an insulating substance.

7. The magnetic memory element as set forth in claim 1, wherein said first to third ferromagnetic layers respectively have a film thickness of not less than 10 Å.

8. The magnetic memory element as set forth in claim 1, wherein said insulating layer has a film thickness of not less than 3 Å and not more than 30 Å.

9. The magnetic memory element as set forth in claim 1, wherein said first ferromagnetic layer is made of a ferrimagnetic material which is a rare earth—transition metal alloy film of a composition near a compensation point.

10. The magnetic memory element as set forth in claim 1, wherein one side of said first ferromagnetic layer the other side of which facing the insulating layer is in contact with an antiferromagnetic layer.

11. The magnetic memory element as set forth in claim 1, wherein said first ferromagnetic layer has a triple-layer structure having a metallic layer between a pair of ferromagnetic layers.

12. The magnetic memory element as set forth in claim 1, wherein a magnetic field for reversing magnetization in said second and third ferromagnetic layers is larger than each of magnetic fields given from the first conductor layer and a second conductor layer, and smaller than a synthetic magnetic field of the magnetic fields.

13. A magnetic memory, comprising the magnetic memory element as set forth in claim 1.

14. A magnetic memory which includes a plurality of ferromagnetic layers having uniaxial anisotropic in-plane magnetization and an insulating layer on axes in parallel with each other, and utilizes a tunnel effect so as to reproduce magnetization information, comprising:
   a first ferromagnetic layer as being a fixed layer and a second ferromagnetic layer as being a storage layer among said plurality of ferromagnetic layers; and
   a first conductor layer for supplying a current between said second ferromagnetic layer and a third ferromagnetic layer which flexibly reverses a direction of magnetization,
   wherein said first conductor layer supplies a current in a direction perpendicular to a direction of magnetization in said first ferromagnetic layer.

15. The magnetic memory as set forth in claim 14, wherein said third ferromagnetic layer has magnetic moment a magnitude of which is substantially the same as said second ferromagnetic layer.

16. The magnetic memory as set forth in claim 14, wherein said third ferromagnetic layer has a coercive force which is smaller than a coercive force in said second ferromagnetic layer disposed adjacent to the first conductor layer.

17. The magnetic memory as set forth in claim 14, wherein a second conductor layer is provided between said first conductor layer and third ferromagnetic layer.

18. The magnetic memory as set forth in claim 14, wherein a fourth ferromagnetic layer is provided via a second conductor layer, outside the first or third ferromagnetic layer.

19. The magnetic memory as set forth in claim 14, wherein said non-magnetic layer between said first and second ferromagnetic layers is an insulating substance.

20. The magnetic memory as set forth in claim 14, wherein said first to third ferromagnetic layers respectively have a film thickness of not less than in 10 Å.

21. The magnetic memory as set forth in claim 14, wherein said insulating layer has a film thickness of not less than 3 Å and not more than 30 Å.

22. The magnetic memory as set forth in claim 14, wherein said first ferromagnetic layer is made of a ferrimagnetic material which is a rare earth—transition metal alloy film of a composition near a compensation point.

23. The magnetic memory as set forth in claim 14, wherein one side of said first ferromagnetic layer the other side of which facing the insulating layer is in contact with an antiferromagnetic layer.

24. The magnetic memory as set forth in claim 14, wherein said first ferromagnetic layer has a triple-layer structure having a metallic layer between a pair of ferromagnetic layers.

25. The magnetic memory as set forth in claim 14, wherein a magnetic field for reversing magnetization in said second and third ferromagnetic layers is larger than each of magnetic fields given from the first conductor layer and a second conductor layer, and smaller than a synthetic magnetic field of the magnetic fields.

26. A manufacturing method of a magnetic memory which includes a plurality of magnetic memory elements having lamination of at least a first ferromagnetic layer, a non-magnetic layer and a second ferromagnetic layer as being a storage layer, the method comprising the steps of:
   forming a laminated film composed of at least said first ferromagnetic layer, said non-magnetic layer and said second ferromagnetic layer in this order from the side of a substrate successively on the substrate;
   processing said laminated film into the shape of each of said plurality of magnetic memory element which is separated from the others;
   forming an insulating layer so as to fill a spacing among said plurality of magnetic memory elements formed on the substrate;
   forming a conductor layer and a third ferromagnetic layer successively on the insulating layer provided over and between said plurality of magnetic memory elements; and
   processing said conductor layer so that the adjacent magnetic memory elements are coupled only in one direction, after processing said third ferromagnetic layer into substantially the same shape of each of said magnetic memory elements.

27. A manufacturing method of a magnetic memory which includes a plurality of magnetic memory elements having lamination of at least a first ferromagnetic layer, a non-magnetic layer and a second ferromagnetic layer as being a storage layer, the method comprising the steps of:
   forming a laminated film composed of at least said first ferromagnetic layer, said non-magnetic layer and said second ferromagnetic layer in this order from the side of a substrate successively on the substrate;
   processing said laminated film into the shape of each of said plurality of magnetic memory element which is separated from the others;
   forming an insulating layer so as to fill a spacing among said plurality of magnetic memory elements formed on the substrate;

forming a first conductor layer and an insulating layer successively on the insulating layer provided over and between said plurality of magnetic memory elements;

processing said first conductor layer so that the adjacent magnetic memory elements are coupled only in one direction;

forming an insulating layer so as to fill a spacing around said processed first conductor layer;

forming a second conductor layer and a third ferromagnetic layer successively on the insulating layer provided over and between said processed first conductor layer; and processing said second conductor layer so that the adjacent magnetic memory elements are coupled only in a direction orthogonally intersecting said first conductor layer, after processing said third ferromagnetic layer into substantially the same shape of the magnetic memory element.

28. A manufacturing method of a magnetic memory which includes lamination of a plurality of ferromagnetic layers and an insulating layer, and a storage portion to store magnetization information, and detects a change in resistance in a current flowing through the storage portion according to a tunnel effect, the method comprising the steps of:

forming a third ferromagnetic layer having uniaxial anisotropic in-plane magnetization on a substrate;

forming a first conductor layer for supplying a current by being coupled with magnetic memory elements adjacent to each other in a direction orthogonally intersecting a direction of magnetization in said third ferromagnetic layer;

forming an insulating layer so as to cover an upper surface of said first conductor layer and fill spacings among said magnetic memory elements;

forming a third conductor layer as being a lower electrode for detecting said change in resistance;

forming a storage portion including a ferromagnetic layer having uniaxial anisotropic in-plane magnetization, and an insulating layer on an axis parallel to magnetization in the third ferromagnetic layer; and forming a second conductor layer, as being an upper electrode which detects said change in resistance, for supplying a current by being coupled with the magnetic memory elements adjacently provided in a direction parallel to the direction of magnetization in said third ferromagnetic layer.

29. The method as set forth in claim 28, wherein said storage portion is formed by laminating a second ferromagnetic layer as being a storage layer to store magnetization information, an insulating layer, a first ferromagnetic layer and an antiferromagnetic layer being exchange-coupled with said first ferromagnetic layer.

30. The method as set forth in claim 29, wherein said first ferromagnetic layer is formed so as to have a triple-layer structure having a metallic layer sandwiched between a pair of ferromagnetic layers.

* * * * *